(12) United States Patent
Yamakami et al.

(10) Patent No.: US 8,418,910 B2
(45) Date of Patent: Apr. 16, 2013

(54) ELECTROCONDUCTIVE BONDING MATERIAL, METHOD FOR BONDING CONDUCTOR, AND METHOD FOR MANUFACTURING SEMICONDUCTOR DEVICE

(75) Inventors: Takatoyo Yamakami, Kawasaki (JP); Takashi Kubota, Kawasaki (JP); Kuniko Ishikawa, Kawasaki (JP); Masayuki Kitajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/367,509

(22) Filed: Feb. 7, 2012

(65) Prior Publication Data
US 2012/0211549 A1  Aug. 23, 2012

(30) Foreign Application Priority Data

Feb. 17, 2011  (JP) .................................. 2011-031643

(51) Int. Cl.
B23K 35/14 (2006.01)
B23K 35/34 (2006.01)
B23K 31/02 (2006.01)

(52) U.S. Cl.
USPC ............ 228/56.3; 148/23; 148/24; 228/248.1

(58) Field of Classification Search .................. None
See application file for complete search history.

(56) References Cited

U.S. PATENT DOCUMENTS

| 5,962,133 A | 10/1999 | Yamaguchi et al. |
| 6,276,597 B1 * | 8/2001 | Budinger et al. ............. 228/225 |
| 7,022,266 B1 * | 4/2006 | Craig ............................. 252/512 |
| 2002/0114726 A1 | 8/2002 | Soga et al. |
| 2003/0224197 A1 * | 12/2003 | Soga et al. ..................... 428/570 |
| 2008/0008776 A1 * | 1/2008 | Back et al. ..................... 424/778 |
| 2009/0220812 A1 | 9/2009 | Kato et al. |
| 2009/0286099 A1 * | 11/2009 | Asada et al. ................... 428/570 |
| 2009/0301607 A1 * | 12/2009 | Nakano et al. .................. 148/24 |
| 2010/0096043 A1 * | 4/2010 | McCluskey et al. ............. 148/24 |
| 2010/0291399 A1 * | 11/2010 | Kato et al. ...................... 428/553 |
| 2011/0136707 A1 * | 6/2011 | Xu et al. ......................... 507/270 |
| 2012/0018048 A1 * | 1/2012 | Yamashita et al. ............... 148/24 |
| 2012/0103135 A1 * | 5/2012 | Xu et al. .......................... 75/233 |
| 2012/0107628 A1 * | 5/2012 | Komatsu et al. ............. 428/457 |

FOREIGN PATENT DOCUMENTS

| JP | 2002-261105 | 9/2002 |
| JP | 2006-102769 | 4/2006 |
| JP | 2008-161881 | 7/2008 |
| JP | 2010-029868 A  * | 2/2010 |
| WO | WO 97/00753 | 1/1997 |
| WO | WO 2007/125861 A1 | 11/2007 |

* cited by examiner

Primary Examiner — Kiley Stoner
(74) Attorney, Agent, or Firm — Squire Sanders (US) LLP

(57) ABSTRACT

An electro-conductive bonding material includes: metal components of a high-melting-point metal particle that have a first melting point or higher; a middle-melting-point metal particle that has a second melting point which is first temperature or higher, and second temperature or lower, the second temperature is lower than the first melting point and higher than the first temperature; and a low-melting-point metal particle that has a third melting point or lower, the third melting point is lower than the first temperature.

10 Claims, 13 Drawing Sheets

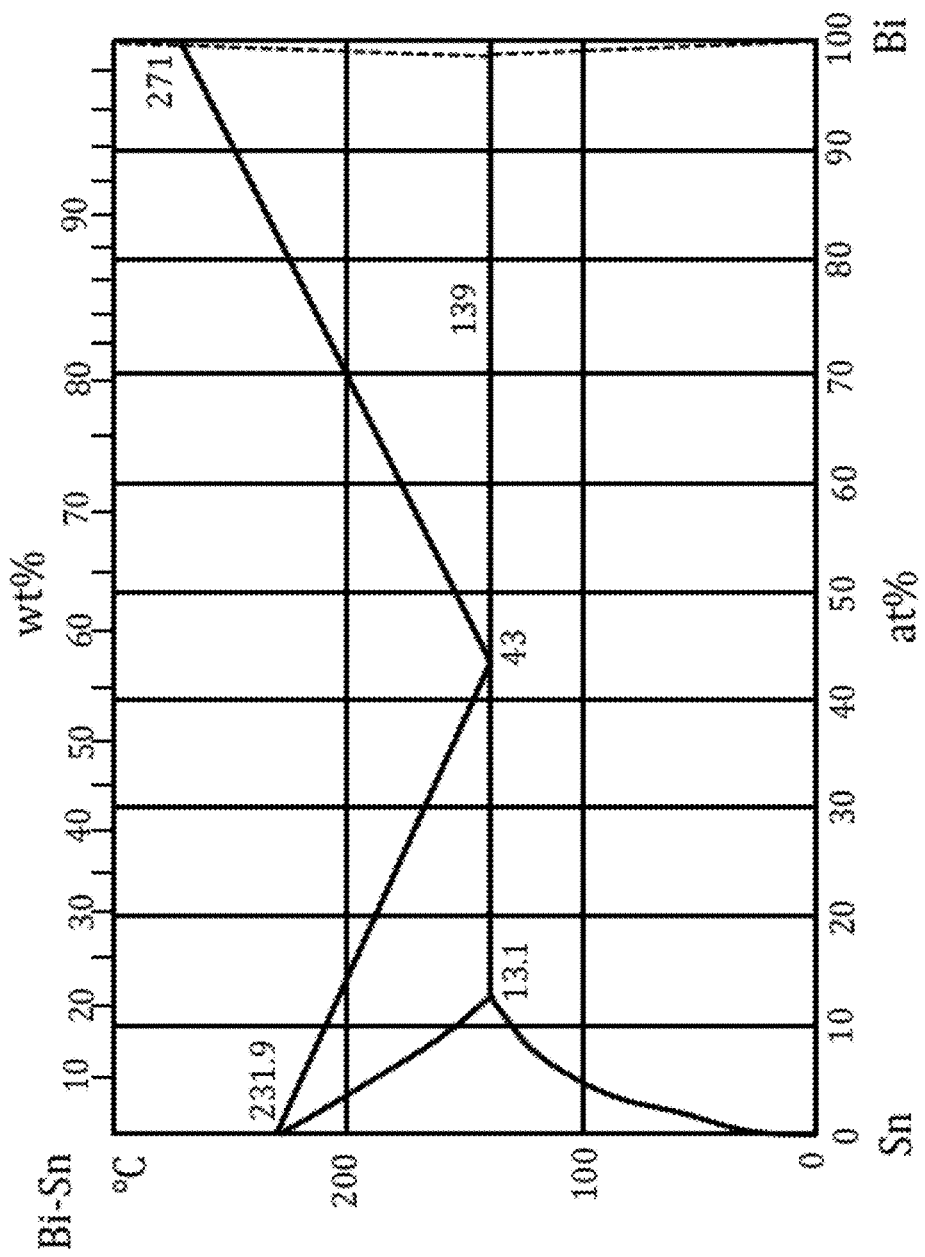

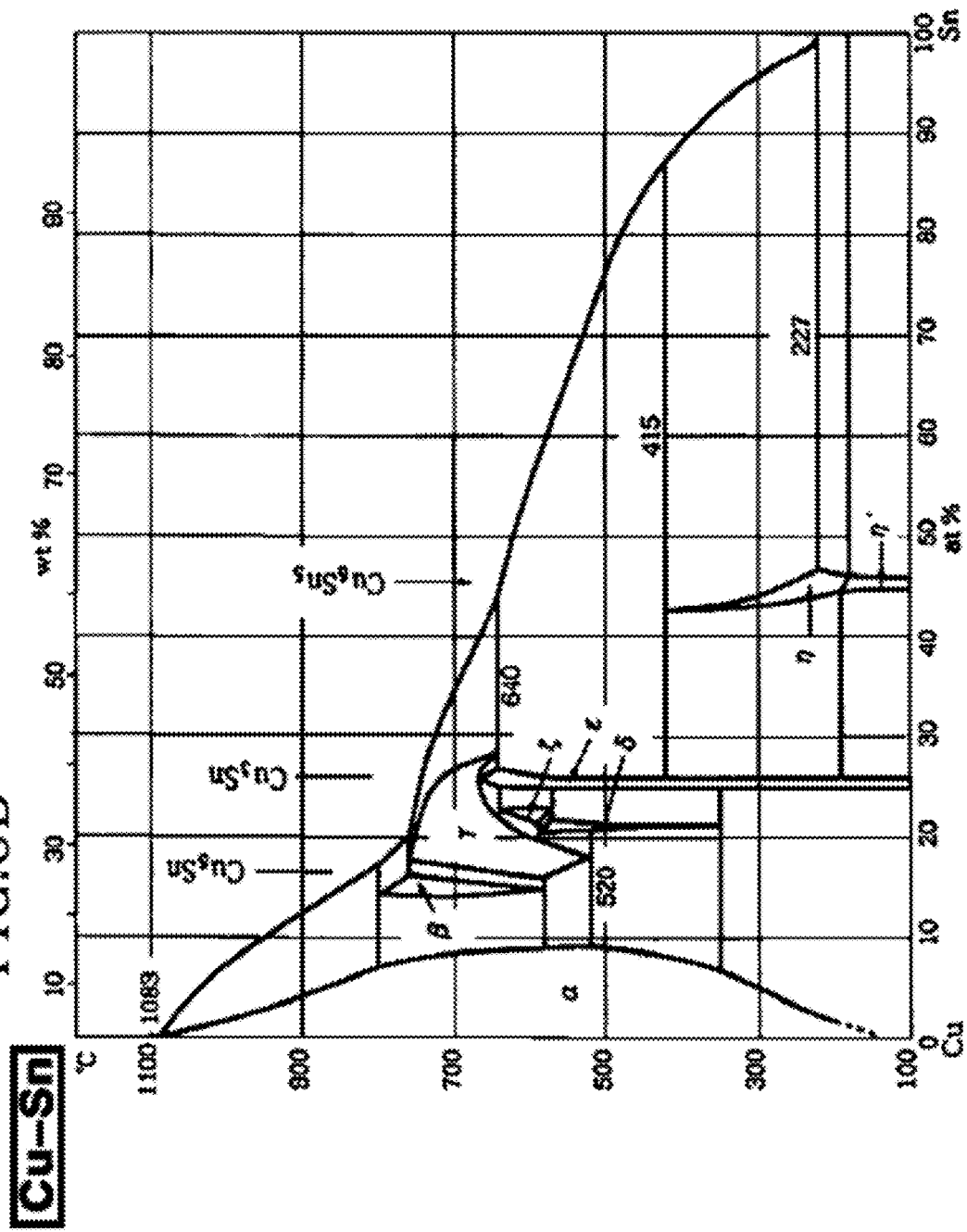

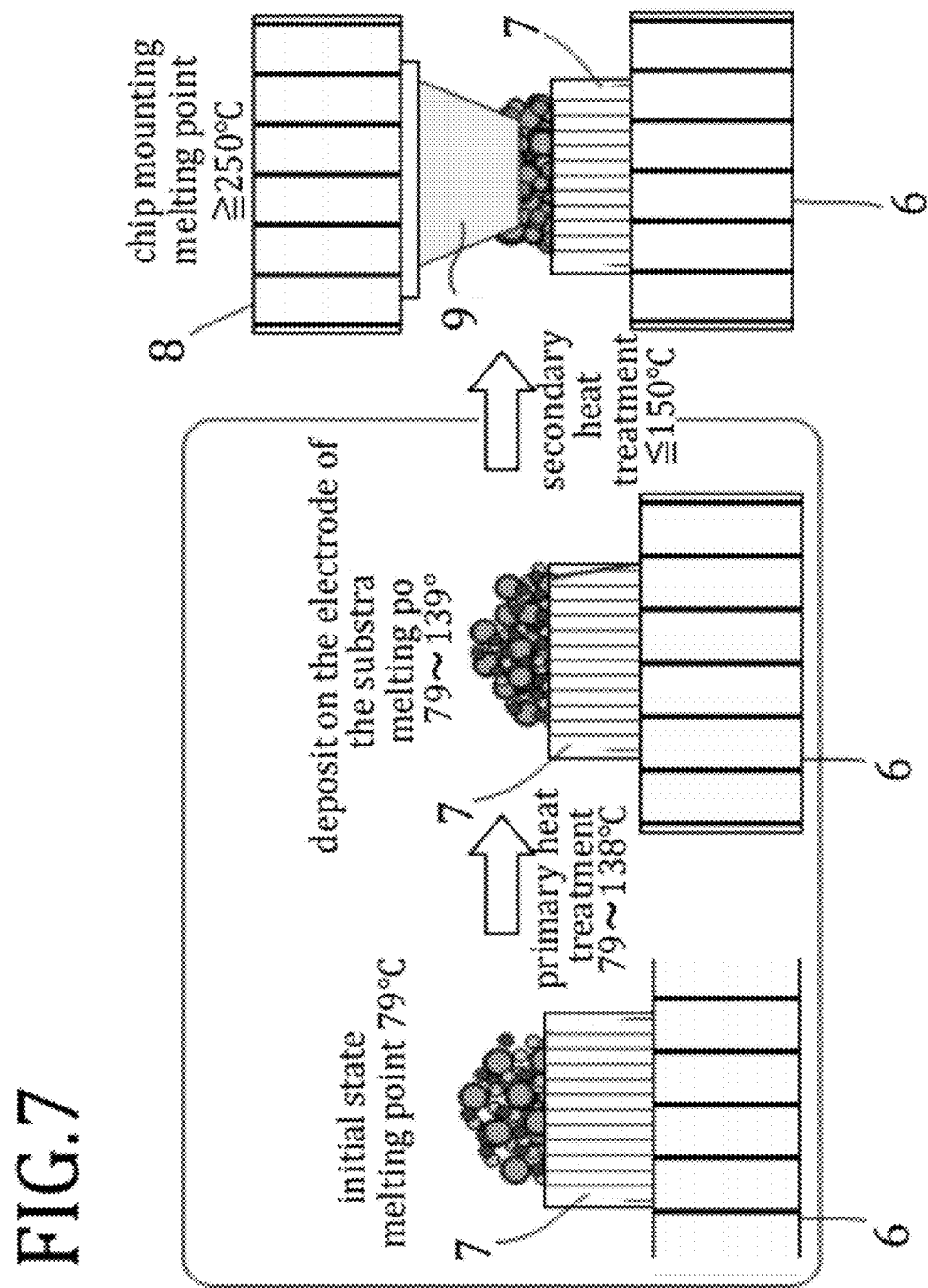

ELECTROCONDUCTIVE BONDING MATERIAL, METHOD FOR BONDING CONDUCTOR, AND METHOD FOR MANUFACTURING SEMICONDUCTOR DEVICE

CROSS REFERENCE TO RELATED APPLICATION

This application is based upon and claims the benefit of priority from the prior Japanese Patent Application NO. 2011-031643 filed on Feb. 17, 2011, the entire contents of which are incorporated herein by reference.

FIELD

The embodiments hereafter are related to an electroconductive bonding material, a method for bonding a conductor, and a method for manufacturing a semiconductor device.

BACKGROUND

To bond electronic components such as semiconductor devices to a substrate such as a glass epoxy substrate, various methods have been proposed to use a low-melting-point metal paste of a variable-melting-point type, whose melting point changes through heat treatment, for suppressing distortion resulting from a difference in coefficients of thermal expansion between the electronic components and the substrate, and achieving a bonding quality (see Japanese Laid-Open Patent Publication No. 2002-261105, Leaflet of WO No. 2007/125861, Japanese Laid-Open Patent Publication No. 2006-102769 and Japanese Laid-Open Patent Publication No. 2008-161881).

For instance, as illustrated in FIG. 1, a low-melting-point metal paste 10 of a variable-melting-point type, which is a conventional electroconductive bonding material, is composed of metal components of a high-melting-point metal particle (Sn—Bi-plated Cu particle) 1 and a low-melting-point metal particle (Sn—Bi particle) 2, and by a flux component 3. The initial melting point of this low-melting-point metal paste 10 of the variable-melting-point type is 139° C. based on the melting point of the low-melting-point metal particle (Sn—Bi particle). When the low-melting-point metal paste 10 of the variable-melting-point type is heated at 150° C. or lower, Sn in the low-melting-point metal particle (Sn—Bi particle) 2 diffuses into the high-melting-point metal particle (Sn—Bi plated Cu particle) 1 to form a Bi-segregated layer 4 and a Cu—Sn-based intermetallic compound 5 and be converted into a metallic bonding state, and thereby the melting point of the low-melting-point metal paste 10 of the variable-melting-point type rises to approximately 250° C. or higher.

Because the melting point of the low-melting-point metal paste of the variable-melting-point type, which is the conventional electroconductive bonding material, thus changes through the heat treatment, the heating temperature which may be selected in an electroconductive bonding-material supply step is restricted to the initial melting point or lower which is the melting point of the low-melting-point metal particle (Sn—Bi particle). As illustrated in FIG. 2, when a substrate 6 and electronic components 8 are bonded to each other, if the low-melting-point metal paste 10 of the variable-melting-point type, which is the conventional electroconductive bonding material, is supplied onto the electrode 7 of the substrate and is heated to deposit onto the electrode of the substrate, the low-melting-point component disappears and the melting point rises to 250° C. or higher. Because of this, the electroconductive bonding-material supply step of previously depositing the low-melting-point metal paste of the variable-melting-point type onto the electrode of the substrate while supplying the material onto the electrode may not be selected, and the problem is that the electronic components may not be mounted on the substrate of the electronic components at a low temperature of 150° C. or lower.

In addition, as illustrated in FIG. 3, when the low-melting-point metal paste of the variable-melting-point type 10, which is the conventional electroconductive bonding material, is charged into the recessed part of a countersunk jig 31, the terminal of the electronic components is pressed to the paste, the resultant product is heated at 150° C. or lower, and the paste is heated/transferred (deposited) onto the terminal 9 of the electronic components 8, the low-melting-point component disappears and the melting point rises to 250° C. or higher. Because of this, the heating and transferring step of once melting the electroconductive bonding material and transferring the material onto the terminal of the electronic components may not be selected, and the problem is that the electronic components may not be mounted on the substrate of the electronic components at a low temperature of 150° C. or lower.

Accordingly, the electroconductive bonding-material supply step of depositing the electroconductive bonding material onto the electrode of the substrate while supplying the material onto the electrode, and the transferring step of once melting the electroconductive bonding material and transferring the material onto the terminal of the electronic components may not be selected, because the low-melting-point component in the conventional electroconductive bonding material disappears by the heat treatment and the melting point rises to 250° C. or higher, and a low-temperature bonding at 150° C. or lower is difficult under present circumstances.

[Document 1] Japanese Laid-Open Patent Publication No. 2002-261105

[Document 2] Leaflet of WO No. 2007/125861

[Document 3] Japanese Laid-Open Patent Publication No. 2006-102769

[Document 4] Japanese Laid-Open Patent Publication No. 2008-161881

SUMMARY

According to one aspect of the embodiments, there is provided an electro-conductive bonding material including metal components of a high-melting-point metal particle that have a first melting point or higher; a middle-melting-point metal particle having a second melting point which is first temperature or higher, and second temperature or lower, the second temperature is lower than the first melting point and higher than the first temperature; and a low-melting-point metal particle having a third melting point or lower, the third melting point is lower than the first temperature.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 6A is a phase diagram of Bi and Sn in an electroconductive bonding material after the secondary heat treatment;

FIG. 6B is a phase diagram of Cu and Sn in the electroconductive bonding material after the secondary heat treatment;

FIG. 7 is a schematic view illustrating one example of a method for bonding a conductor according to the present invention;

DESCRIPTION OF THE PREFERRED EMBODIMENTS

Figure 1:
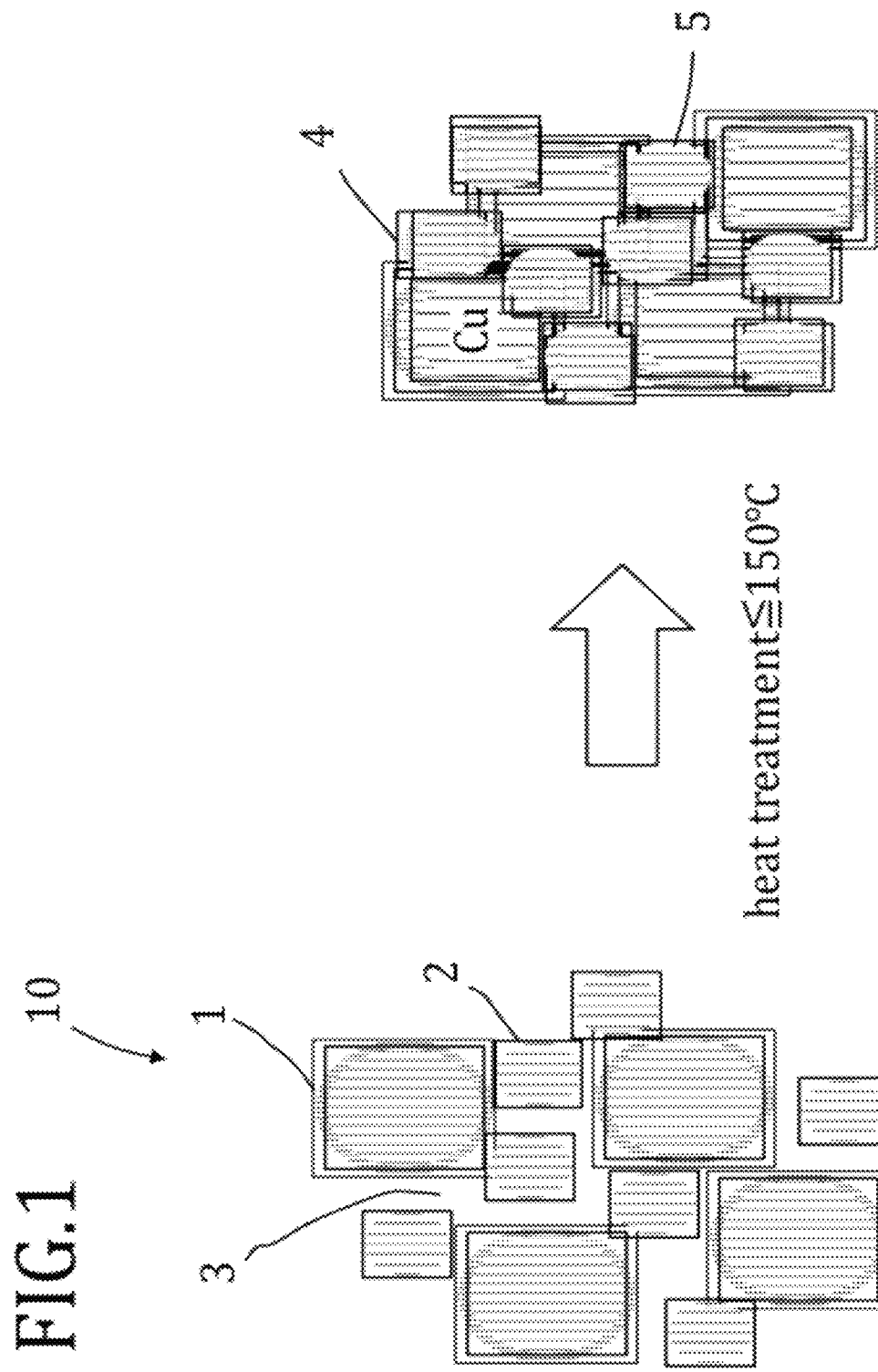
FIG. 1 is a schematic view illustrating a conventional electroconductive bonding material, and a state of the electroconductive bonding material after having been subjected to heating.
Figure 2:
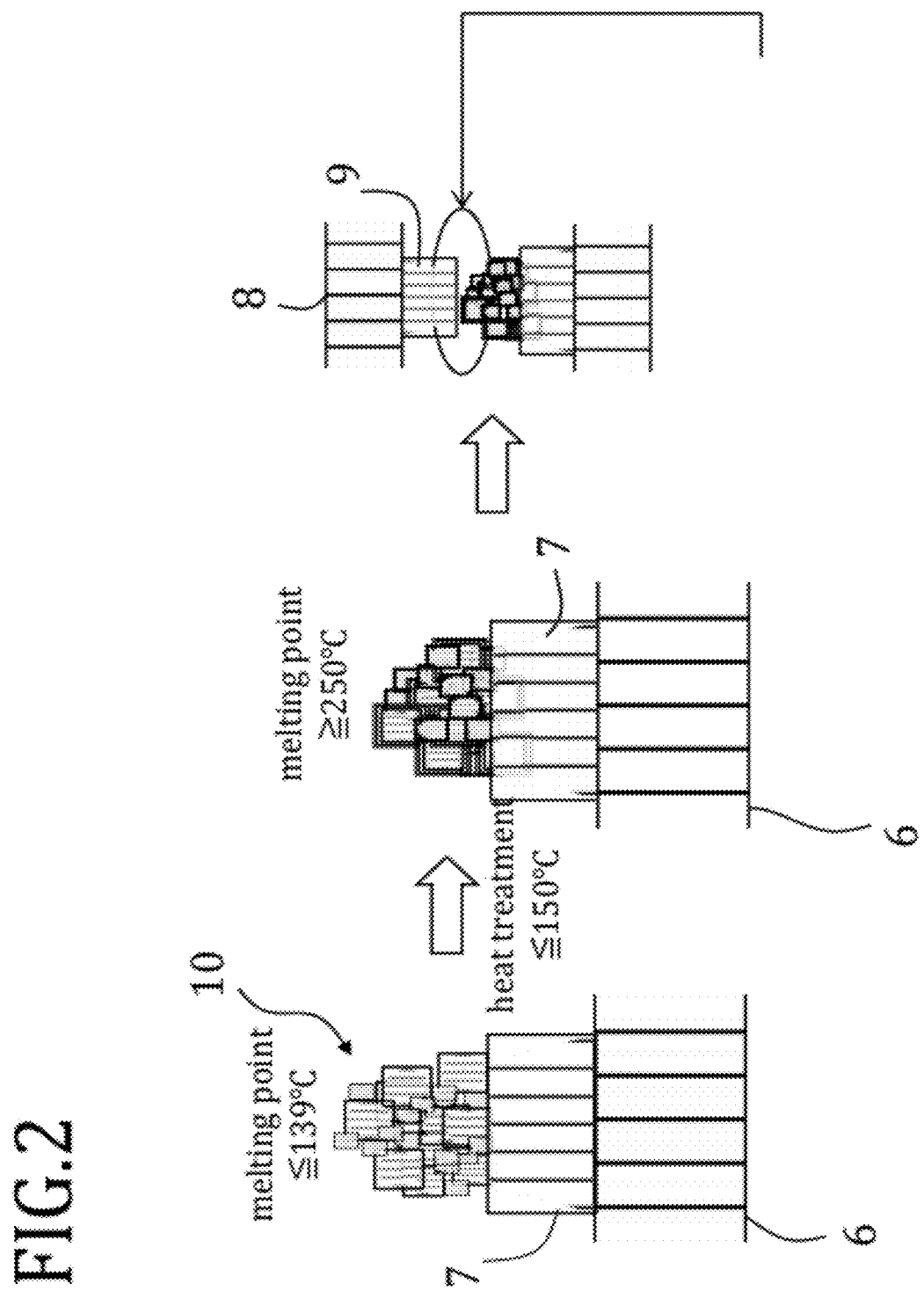
FIG. 2 is a schematic view illustrating a state in which the conventional electroconductive bonding material is supplied to an electrode of a substrate, and the electrode is bonded to a terminal of electronic components.
Figure 3:
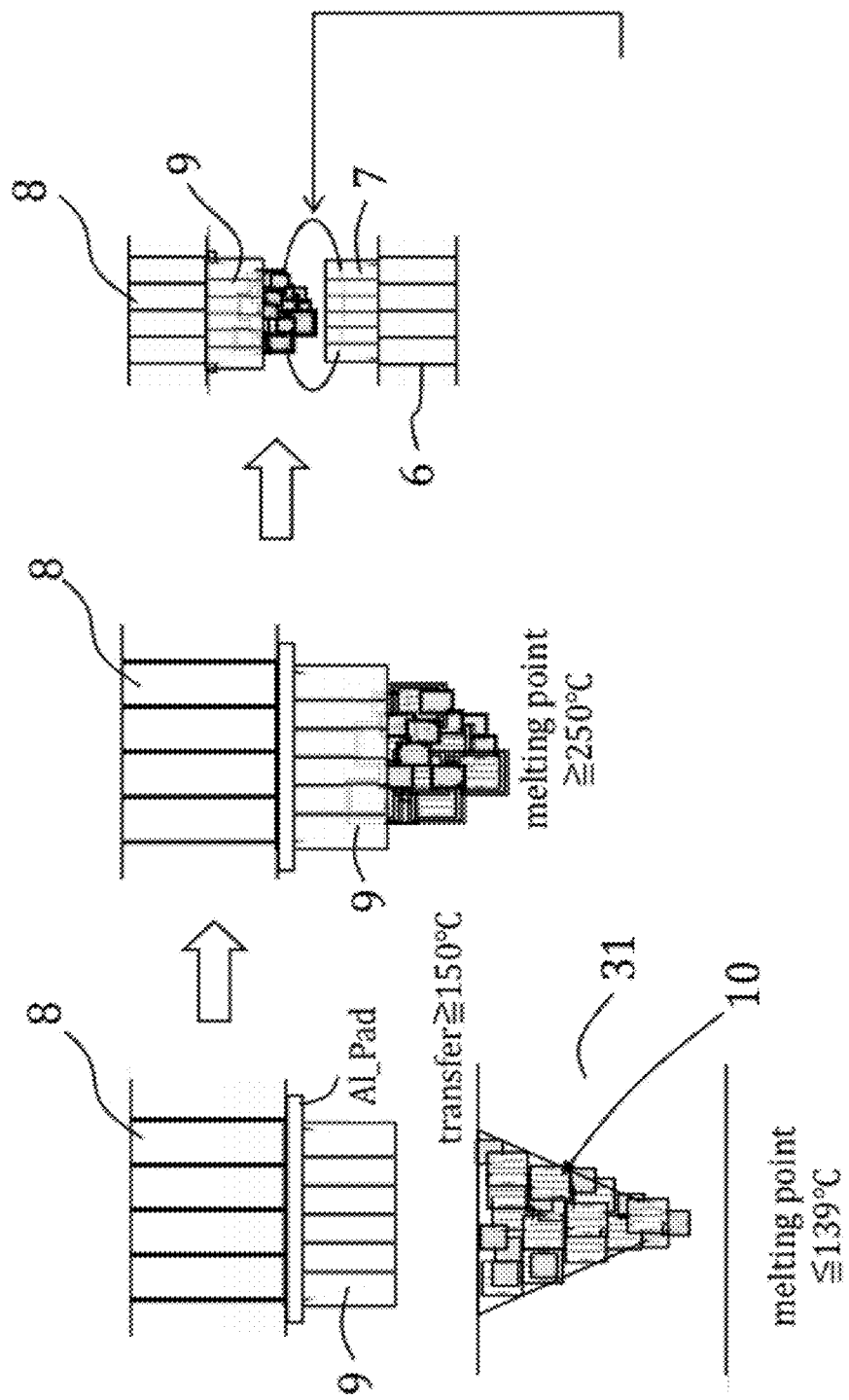
FIG. 3 is a schematic view illustrating a state in which the conventional electroconductive bonding material is heated and transferred onto the electronic components, and the electronic components are bonded to the electrode of the substrate.

An extensive investigation on a method for solving the above described problems is performed, and as a result, that is described hereafter is found. In an electro-conductive bonding material containing metal components of a high-melting-point metal particle having a melting point of 150° C. or higher, a middle-melting-point metal particle having a melting point of 80° C. or higher and 139° C. or lower, and a low-melting-point metal particle having a melting point of 79° C. or lower, the melting point in the initial state is 79° C. which is the melting point of the low-melting-point metal particle; when this electro-conductive bonding material is subjected to the primary heat treatment at 79° C. to 138° C., the material is converted into a metallic bonding state (1) in which the melting point is 79° C. to 139° C.; in this metallic bonding state (1), a low-melting-point component having a melting point of 139° C. or lower remains; next, when the material in the metallic bonding state (1) is further subjected to the secondary heat treatment at 150° C. or higher, the low-melting-point metal particle and the middle-melting-point metal particle diffuse into the high-melting-point metal particle to form a Bi-segregated layer, a Cu—Sn-based intermetallic compound, a Cu—In-based intermetallic compound and a Cu—Sn—In-based intermetallic compound, and the metallic bonding state (1) is converted into a metallic bonding state (2) in which the melting point becomes 250° C. or higher; and accordingly, by using an electro-conductive bonding material containing a metal compound which is formed of the high-melting-point metal particle having the melting point of 150° C. or higher, the middle-melting-point metal particle having the melting point of 80° C. or higher and 139° C. or lower, and the low-melting-point metal particle having the melting point of 79° C. or lower, and has three stages of melting points, a low-melting-point component may be surely left even after the primary heat treatment, which accordingly enables the electro-conductive bonding-material supply step of depositing the electro-conductive bonding material onto the electrode of the substrate while supplying the material onto the electrode, and the transferring step of once melting the electro-conductive bonding material and transferring the material onto the terminal of electronic components to be selected, which have been conventionally difficult, enables the electronic components to be efficiently bonded onto the substrate at a low temperature of 150° C. or lower, and also may change the melting point to a high temperature region of 250° C. or higher after the electronic components have been mounted on the substrate.

(Electro-Conductive Bonding Material)

An electroconductive bonding material according to the present invention includes a metal component, preferably includes a flux component, and further includes another component, as needed.

<Metal Component>

The above described metal component is formed of a high-melting-point metal particle, a middle-melting-point metal particle and a low-melting-point metal particle.

<<High-Melting-Point Metal Particle>>

The melting point of the above described high-melting-point metal particle is 150° C. or higher, preferably is 300° C. or higher, and more preferably is 500° C. or higher. When the melting point of the above described high-melting-point metal particle is lower than 150° C., the difference between the melting points of itself and the middle-melting-point metal particle becomes small, and a low-temperature bonding at 150° C. or lower may become difficult.

The melting point of the above described high-melting-point metal particle may be measured, for instance, with differential scanning calorimetry (DSC).

The shape, the average particle size, the structure and the like of the above described high-melting-point metal particles are not intended to be limiting and may be appropriately selected according to the purpose, as long as the high-melting-point metal particles are metal particles which satisfy the above described melting point.

The above described high-melting-point metal particle includes, for instance, an Au particle, an Ag particle, a Cu particle, an Au-plated Cu particle, an Sn—Bi-plated Cu particle and an Ag-plated Cu particle. These particles may be used solely, or two or more of the particles may be concomitantly used. Among them, the Sn—Bi-plated Cu particle, the Ag-plated Cu particle, the Au-plated Cu particle, and the Cu particle are particularly preferable from the viewpoint of wettability of a solder.

The above described Sn—Bi-plated Cu particle includes, for instance, an Sn-58Bi-plated Cu particle.

The shape of the above described high-melting-point metal particle includes, for instance, a spherical shape, a genuine sphere shape and a rugby ball shape.

The structure of the above described high-melting-point metal particle may be a single layer structure or a stacked structure.

The average particle size of the above described high-melting-point metal particle is preferably 30 μm to 50 μm, and more preferably is 35 μm to 45 μm.

The content of the above described high-melting-point metal particle in the above described metal component is preferably 80 mass % to 90 mass %, and more preferably is 83 mass % to 87 mass %. When the above described content is less than 80 mass %, the conduction resistance of a bonded portion may increase, and when the content exceeds 90 mass %, the wettability of the solder may be aggravated and the conduction resistance may increase.

The above described high-melting-point metal particle is not intended to be limiting, and may employ an appropriately manufactured particle or employ a commercialized product. A method for manufacturing the above described high-melting-point metal particle includes, for instance, a powdering method with an atomization process.

<<Middle-Melting-Point Metal Particle>>

The melting point of the above described middle-melting-point metal particle is 80° C. or higher and 139° C. or lower, and preferably is 80° C. to 130° C. When the melting point of the above described middle-melting-point metal particle is lower than 80° C., the difference between the melting points of itself and the low-melting-point metal particle may disappear. When the melting point of the above described middle-melting-point metal particle exceeds 139° C., the difference between the melting points of itself and the high-melting-point metal particle becomes small, the electroconductive bonding-material supply step and the transferring step may not be selected, and low-temperature bonding at 150° C. or lower may become difficult.

The melting point of the middle-melting-point metal particle may be measured, for instance, with differential scanning calorimetry (DSC).

The above described middle-melting-point metal particle includes, for instance, an Sn—Bi particle and an Sn—Bi—Ag particle.

The above described Sn—Bi particle includes, for instance, an Sn-58Bi particle.

The above described Sn—Bi—Ag particle includes, for instance, an Sn-57Bi-1Ag particle.

The shape of the above described middle-melting-point metal particle includes, for instance, a spherical shape, a genuine sphere shape and a rugby ball shape.

The structure of the above described middle-melting-point metal particle may be a single layer structure or a stacked structure.

The average particle size of the above described middle-melting-point metal particles is preferably 10 μm to 40 μm, and more preferably is 20 μm to 30 μm.

The content of the middle-melting-point metal particle in the above described metal component is preferably 5 mass % to 15 mass %, and more preferably is 10 mass % to 15 mass %. When the above described content is less than 5 mass %, the wettability of the solder may be aggravated and the conduction resistance may increase, and when the content exceeds 15 mass %, a problem may occur in the change of the melting point.

The above described middle-melting-point metal particle is not intended to be limiting, and may employ an appropriately manufactured particle or employ a commercialized product. A method for manufacturing the above described middle-melting-point metal particle includes, for instance, an atomization process.

<<Low-Melting-Point Metal Particle>>

The melting point of the above described low-melting-point metal particle is 79° C. or lower, and preferably is 70° C. to 79° C. When the above described melting point exceeds 79° C., the difference between the melting points of itself and the middle-melting-point metal particle becomes small, the electroconductive bonding-material supply step and the transferring step may not be selected, and low-temperature bonding at 150° C. or lower may become difficult.

The melting point of the above described low-melting-point metal particle may be measured, for instance, with differential scanning calorimetry (DSC).

The above described low-melting-point metal particle includes, for instance, an Sn—Bi—In particle and an Sn—Bi—Ga particle.

The above described Sn—Bi—In particle includes, for instance, a 17Sn-58Bi-25In particle and a 12Sn-41Bi-47In particle.

The shape of the above described low-melting-point metal particle includes, for instance, a spherical shape, a genuine sphere shape and a rugby ball shape.

The structure of the above described low-melting-point metal particle may be a single layer structure or a stacked structure.

The average particle size of the above described low-melting-point metal particles is preferably 10 μm to 40 μm, and more preferably is 20 μm to 30 μm.

The content of the low-melting-point metal particle in the above described metal component is preferably 5 mass % to 15 mass %, and more preferably is 10 mass % to 15 mass %. When the above described content is less than 5 mass %, the wettability of the solder may be aggravated and the conduction resistance may increase, and when the content exceeds 15 mass %, a problem may occur in the change of the melting point.

The above described low-melting-point metal particle is not intended to be limiting, and may employ an appropriately manufactured particle or employ a commercialized product. A method for manufacturing the above described low-melting-point metal particle includes, for instance, an atomization process.

The above described metal component may employ metal components of the above described high-melting-point metal particle, the above described middle-melting-point metal particle, and the above described low-melting-point metal particle, as describe above, but may employ a multilayer metal particle as well other than the above metal particles, which has a middle-melting-point metal layer formed of a middle-melting-point metal particle and a low-melting-point metal layer formed of a low-melting-point metal particle formed on the surface of the high-melting-point metal particle, in this order. The multilayer metal particle is preferable in that the electroconductive bonding material consisting of one multilayer metal particle may be thereby obtained. When the multilayer metal particle has the low-melting-point metal layer formed of the low-melting-point metal particle and the middle-melting-point metal layer formed of the middle-melting-point metal particle formed on the surface of the high-melting-point metal particle, in this order, low-temperature bonding at 150° C. or lower may become difficult because of having no low-melting-point metal layer on the outermost surface.

The above described multilayer metal particle is not intended to be limiting, and may employ an appropriately manufactured particle or employ a commercialized product.

The above described high-melting-point metal particle may employ the same metal particle as the above described high-melting-point metal particle.

The average particle size of the above described high-melting-point metal particles is preferably 40 μm or less, and preferably is 30 μm to 40 μm. When the above described average particle size exceeds 40 μm, a problem may occur in bonding for a fine contact.

The average thickness of the middle-melting-point metal layers is preferably 1 μm or more, and more preferably is 1 μm to 5 μm. When the above described average thickness is less than 1 µm, the amount of the middle-melting-point metal becomes small, and low-temperature bonding at 150° C. or lower may become difficult.

The above described middle-melting-point metal layer may be formed, for instance, with an electroless plating technique or the like.

The average thickness of the above described low-melting-point metal layer is preferably 1 µm or more, and more preferably is 1 µm to 5 µm. When the above described average thickness is less than 1 µm, the amount of the low-melting-point metal becomes small, and low-temperature bonding at 150° C. or lower may become difficult.

The above described low-melting-point metal layer may be formed, for instance, with an electroless plating technique or the like.

The content of the electroconductive bonding material in the above described metal component is not intended to be limiting, and may be appropriately selected according to the purpose; but is preferably 50 mass % to 95 mass %; and more preferably is 70 mass % to 90 mass %.

<Flux Component>

The above described flux component may employ at least any one of an epoxy-based flux material and a rosin-based flux material. Among the materials, the epoxy-based flux material is particularly preferable in that the epoxy-based flux material may enhance the bonding strength by the curing of an epoxy resin.

-Epoxy-Based Flux Material-

The above described epoxy-based flux material includes the epoxy resin, a carboxylic acid and a solvent, and further includes another component, as needed.

The above described epoxy resin is not intended to be limiting, but may be appropriately selected according to the purpose, and includes, for instance, a thermosetting epoxy resin such as a bisphenol A type epoxy resin, a bisphenol F type epoxy resin, a novolak type epoxy resin and a modified epoxy resin thereof. These epoxy resins may be used solely, or two or more of the epoxy resins may be concomitantly used.

The above described carboxylic acid is preferably selected from the group consisting of a saturated-aliphatic-based dicarboxylic acid, an unsaturated-aliphatic-based dicarboxylic acid, an annular-aliphatic-based dicarboxylic acid, an amino-group-containing carboxylic acid, a hydroxy-group-containing carboxylic acid, a heterocyclic dicarboxylic acid and a mixture thereof. Specifically, the carboxylic acid includes succinic acid, glutaric acid, adipic acid, azelaic acid, dodecanedioic acid, itaconic acid, mesaconic acid, cyclobutanedicarboxylic acid, L-glutamic acid, citric acid, malic acid, thiopropionic acid, thiodibutyric acid and dithioglycolic acid.

The above described solvent includes, for instance: alcohols such as methanol, ethanol and propanol; diethylene glycol monohexylether; and octanediol.

An additive, for instance, such as a thixotropic agent, a chelating agent, a surface active agent and an antioxidant may also be added into the epoxy-based flux material as the above described another component.

The above described epoxy-based flux material is not intended to be limiting, and may appropriately employ a synthesized material or employ a commercialized product.

-Rosin-Based Flux Material-

The above described rosin-based flux material includes a rosin resin, an active agent and a solvent, and further includes another component, as needed.

The above described rosin resin includes a resin which contains a natural rosin resin or a modified rosin resin as a main component. The above described modified rosin resin includes, for instance, a polymerized rosin, a hydrogenated rosin, a phenol-resin-modified rosin and a maleic-acid-modified rosin.

The above described active agent includes an inorganic active agent and an organic active agent, and includes, for instance, a halogen-based active agent such as an amine hydrochloride, and an organic-acid-based active agent.

The above described solvent includes, for instance, diethylene glycol monohexyl ether and octanediol.

An additive, for instance, such as a thixotropic agent, a chelating agent, a surface active agent and an antioxidant may also be added into the rosin-based flux material as the above described another component.

The above described rosin-based flux material is not intended to be limiting, and may appropriately employ a synthesized material or employ a commercialized product.

The content of the above described flux component in the above described electroconductive bonding material is preferably 5 mass % to 50 mass %, and more preferably 10 mass % to 30 mass %.

<<Other Components>>

The above described electroconductive bonding material may contain another component than the above described metal component and the above described flux component, as needed. The above described another component includes, for instance, a dispersing agent and an antioxidant.

Here, the electroconductive bonding material according to the present invention will be described with reference to the drawings.

Figure 4:
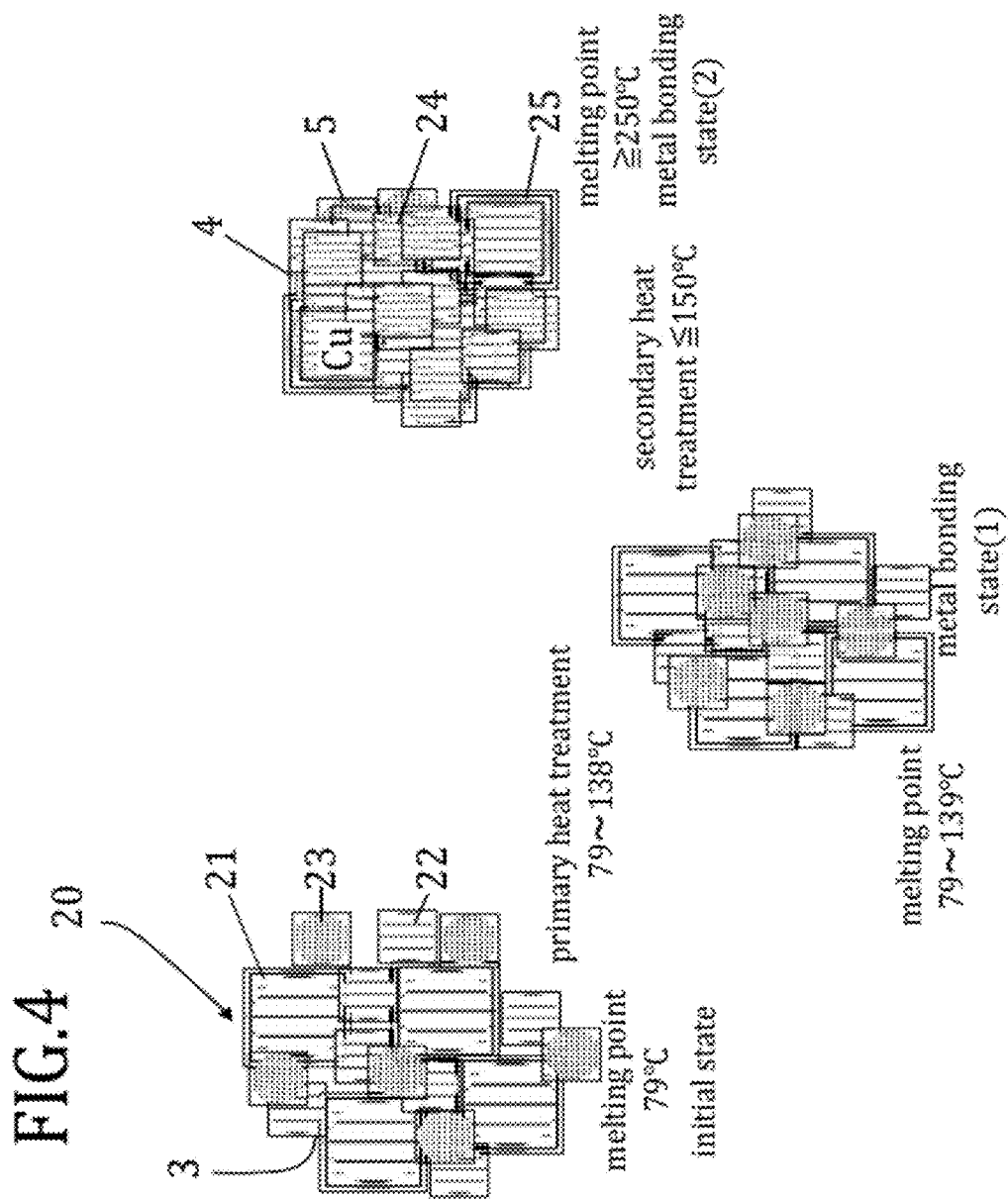
FIG. 4 is a schematic view illustrating an electroconductive bonding material according to the present invention, and a state of the electroconductive bonding material after having been subjected to heating.

FIG. 4 is a schematic view illustrating one example of an electroconductive bonding material 20 according to the present invention. This electroconductive bonding material 20 is composed of metal components of a high-melting-point metal particle (Sn-58Bi-plated Cu particle with melting point of 1,083° C.) 21, a middle-melting-point metal particle (Sn-58Bi particle with melting point of 139° C.) 22 and a low-melting-point metal particle (17Sn-58Bi-25In particle with melting point of 79° C.) 23, and by a flux component 3. The initial melting point of this electroconductive bonding material 20 is 79° C. based on the melting point of the low-melting-point metal particle (17Sn-58Bi-25In particle).

When this electroconductive bonding material 20 is subjected to the primary heat treatment (79° C. to 138° C.), a metallic bonding state (1) is formed. The melting point in this metallic bonding state (1) is 79° C. to 139° C. based on the melting point of the middle-melting-point metal particle (Sn-58Bi particle) 22, and the low-melting-point component having the melting point of 139° C. or lower remains.

Next, when this metallic bonding state (1) is subjected to the secondary heat treatment (150° C. or lower), Sn in the low-melting-point metal particle (17Sn-58Bi-25In particle) 23 and the middle-melting-point metal particle (Sn-58Bi particle) 22 diffuses into the high-melting-point metal particle (Sn—Bi-plated Cu particle) 21 to form a Bi-segregated layer 4, a Cu—Sn-based intermetallic compound 5, a Cu—In-based intermetallic compound 24 and a Cu—Sn—In-based ternary intermetallic compound 25, the metallic bonding state (1) is converted into a metallic bonding state (2), and the melting point thereof rises to 250° C. or higher.

Figure 5:
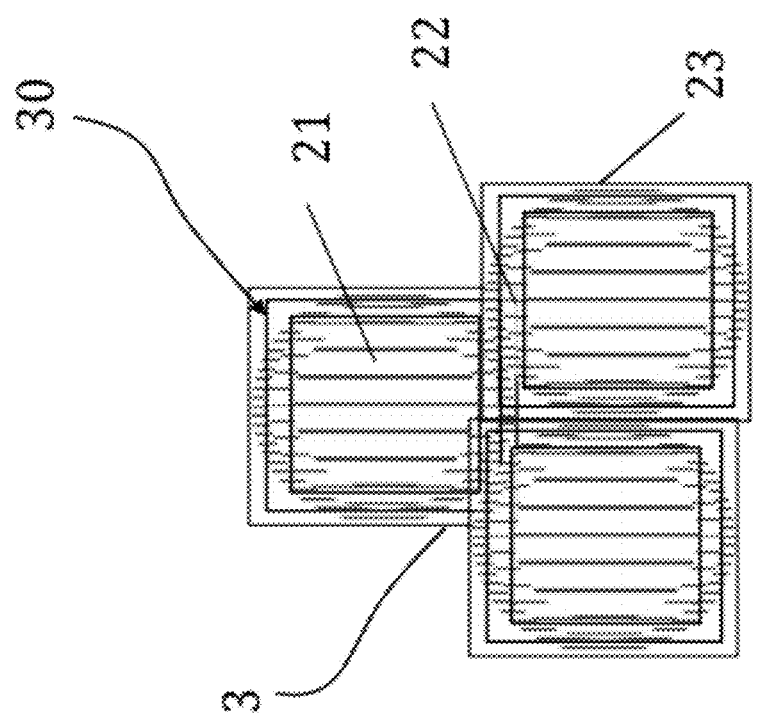
FIG. 5 is a schematic view illustrating another example of an electroconductive bonding material according to the present invention.

In addition, FIG. 5 is a schematic view illustrating another example of an electroconductive bonding material 30 according to the present invention. This electroconductive bonding material 30 is composed of a multilayer metal particle which has a high-melting-point metal particle (Sn-58Bi-plated Cu particle with melting point of 1,083° C.) 21, and a middle-melting-point metal layer 22' formed of a middle-meltingpoint metal particle (Sn-58Bi particle with melting point of 139° C.) and a low-melting-point metal layer 23' formed of a low-melting-point metal particle (17Sn-58Bi-25In particle with melting point of 79° C.) on the surface of this high-melting-point metal particle, in this order, and by a flux component 3.

When this electroconductive bonding material 30 is subjected to the primary heat treatment (79° C. to 138° C.), a metallic bonding state (1) is formed. The melting point in this metallic bonding state (1) is 79° C. to 139° C. based on the melting point of the middle-melting-point metal layer 22' formed of the middle-melting-point metal particle (Sn-58Bi particle), and the low-melting-point component having the melting point of 139° C. or lower remains.

Next, when this metallic bonding state (1) is subjected to the secondary heat treatment (150° C. or lower), Sn in the low-melting-point metal particle (17Sn-58Bi-25In particle) 23 and the middle-melting-point metal particle (Sn-58Bi particle) 22 diffuses into the high-melting-point metal particle (Sn—Bi-plated Cu particle) 21 to form a Bi-segregated layer 4, a Cu—Sn-based intermetallic compound 5, a Cu—In-based intermetallic compound 24 and a Cu—Sn—In-based ternary intermetallic compound 25, the metallic bonding state (1) is converted into a metallic bonding state (2), and the melting point thereof rises to 250° C. or higher.

Here, as described above, the electroconductive bonding material in the metallic bonding state (1) after the primary heat treatment is subjected to the secondary heat treatment, and then Sn in the Sn—Bi alloy or the Sn—Bi—In alloy and In in the Sn—Bi—In alloy diffuse into Cu. Along with the diffusion, the Bi-segregated layer is formed and the metallic bonding state (1) is converted to the metallic bonding state (2). It has been found as a result that the melting point of the Bi-segregated layer becomes 250° C. or higher by setting the content of Bi to 95 mass % or more as illustrated in FIG. 6A, in other words, the melting point of the metallic bonding state (2) becomes 250° C. or higher.

In addition, in the electroconductive bonding material, Sn diffuses into Cu due to the secondary heat treatment to form a Cu—Sn intermetallic compound layer, and the metallic bonding state (1) is converted into the metallic bonding state (2). It has been found as a result that the melting point of the Cu—Sn-based intermetallic compound layer becomes 250° C. or higher by setting the content of the Cu at 3 mass % or more, as illustrated in FIG. 6B, in other words, the melting point of the metallic bonding state (2) becomes 250° C. or higher.

Figure 6C:
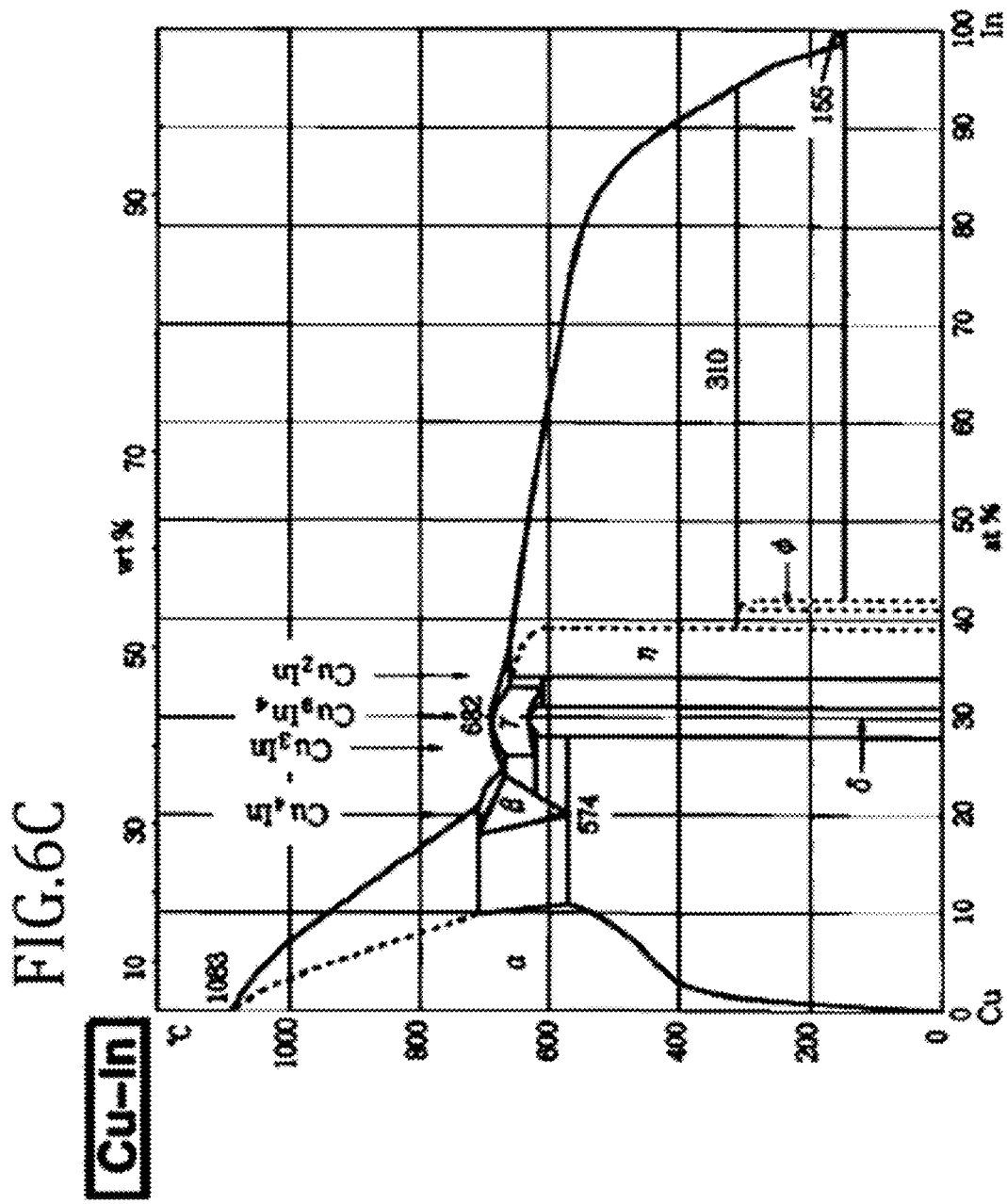
FIG. 6C is a phase diagram of Cu and In in the electroconductive bonding material after the secondary heat treatment.

In addition, in the electro-conductive bonding material, In diffuses into Cu due to the secondary heat treatment to form a Cu—In intermetallic compound layer, and the metallic bonding state (1) is converted into the metallic bonding state (2). It has been found as a result that the melting point of the Cu—In-based intermetallic compound layer becomes 250° C. or higher by setting the content of the Cu at 3 mass % or more as illustrated in FIG. 6C, in other words, the melting point of the metallic bonding state (2) becomes 250° C. or higher.

The electroconductive bonding material according to the present invention is prepared by mixing the above described metal component, the above described flux component, and another component, as needed. The above described mixing method and the condition are not intended to be limiting, and may be appropriately selected according to the purpose. The mixing operation may be conducted by using a known mixing device, a stirring device and the like, and it is preferable to uniformly stir the components in a non-oxidative atmosphere.

The electroconductive bonding material according to the present invention enables an electroconductive bonding-material supply step and a transferring step which have been conventionally difficult to be selected, and the substrate and the electronic components to be efficiently bonded to each other at a low temperature of 150° C. or lower. Accordingly, the electroconductive bonding material may be used in various fields which use an electroconductive bonding material, but may be preferably used for a method for bonding a conductor according to the present invention, and a method for manufacturing a semiconductor according to the present invention, which will be described later.

(Method for Bonding Conductor)

The method for bonding the conductor according to the present invention includes an electroconductive bonding-material supply step, a primary heat treatment step and a secondary heat treatment step, and further includes another step, as needed.

<Electroconductive Bonding-Material Supply Step>

The above described electroconductive bonding-material supply step is a step of supplying the above described electroconductive bonding material according to the present invention to any one of an electrode of a substrate and a terminal of electronic components.

<<Substrate>>

The shape, the structure, the size and the like of the above described substrate are not intended to be limiting, and may be appropriately selected according to the purpose. The above described shape includes, for instance, a flat shape. The above described structure may be a single layer structure or a stacked structure. The above described size may be appropriately selected according to the size of the above described electrode layer or the like.

The above described substrate includes, for instance: a glass substrate, a quartz substrate, a silicon substrate and an $SiO_2$-film-coated silicon substrate; and a polymer substrate such as an epoxy resin, a phenol resin, a polyethylene terephthalate substrate, a polycarbonate substrate, a polystyrene substrate and a polymethylmethacrylate substrate. These substrates may be used solely, or two or more of the substrates may be concomitantly used. Among the above substrates, the glass substrate, the quartz substrate, the silicon substrate and the $SiO_2$-film-coated silicon substrate are preferably selected, and the silicon substrate and the $SiO_2$-film-coated silicon substrate are particularly preferable.

The above described substrate may be an appropriately synthesized substrate or may employ a commercialized product.

The thickness of the above described substrate is not intended to be limiting, and may be appropriately selected according to the purpose. The thickness is preferably 100 μm or more, and more preferably is 500 μm or more.

As the above described substrate, a wiring-circuit board having a wiring pattern formed thereon is used. The circuit board may be a single-layer circuit board (single-layer printed wiring board) or a multilayer circuit board (multilayer printed wiring board).

The metal constituting the electrode of the above described circuit board includes, for instance, a metal such as Cu, Ag, Au, Ni, Sn, Al, Ti, Pd and Si. Among the above metals, Cu, Ag and Au are particularly preferable. These metals may be formed as a surface portion of an electrode metal on the substrate, by various treatments such as plating and lamination. For information, when the electroconductive bonding material is applied onto the electrode metal on the substrate, the electrode metal on the substrate generally has a coating so that the electroconductive bonding material may be adequately connected to the electrode metal on the substrate. For instance, a copper electrode is plated with a thin film such as Sn, Au and Ni formed on the electrode, for example. The surfaces of metals except for Au out of the above described metals in particular are easily oxidized, and accordingly, it is preferable to treat the surfaces of the metals with flux or the like, to precoat the metals with flux, to plate the metals with various metals or to coat the metals with solder, before a soldering paste is applied to the metals.

-Electronic Components-

The above described electronic components are not intended to be limiting, as long as the electronic components have a terminal. The electronic components may have a known member and the like which are appropriately selected according to the purpose, and may be used for a semiconductor device and a semiconductor package, for instance, a flash memory, a DRAM, an FRAM, an MOS transistor and the like, which may be preferably used in various fields.

<<Terminal>>

The above described terminal is not intended to be limiting, may be appropriately selected according to the purpose, and includes, for instance, a wire, a metallic wire and a printed wire with an electroconductive paste.

The material of the above described terminal is not intended to be limiting, may be appropriately selected according to the purpose, and includes, for instance, a metal such as Cu, Ni, Au, Al, Mo and Cr, a metal oxide such as ITO and IZO, and a stacked body or composite thereof.

-Supplying Method-

The method for supplying the above described electroconductive bonding material is not intended to be limiting as long as the electroconductive bonding material may be applied to form a film with a fixed thickness, or in a fixed application amount. The method may be appropriately selected according to the purpose, and includes, for instance, a screen printing, a transfer printing, a dispensing and ejecting and an ink jet printing.

The above described screen printing may employ a printing machine with the use of a mask plate. The printing machine typically includes: a mechanism of fixing a substrate or electronic components; a mechanism of aligning a metal mask with the electrode of the substrate or the terminal of the electronic components; and a mechanism of pressure-welding the mask plate to the substrate or the electronic components, and a mechanism of imprinting the electroconductive bonding material from above the mask with respect to the electrode of the substrate or the terminal of the electronic components under the mask, through the aperture with a squeegee for application. As for the mask plate, there exist various materials such as a mesh type mask and a metal type mask, but the metal type mask which widely corresponds to the particle size and is easily cleaned in the process is generally widely used.

The above described transfer printing is a method for forming a flatly-applied coating film having a fixed thickness of the electroconductive bonding material with a squeegee having a fixed clearance, extracting the coating film with a stamper, stamping the extracted coating film onto the electrode of the substrate or the terminal of the electronic components, and thereby arranging a fixed amount of the electroconductive bonding material on the electrode of the substrate or the terminal of the electronic components; and uses a dedicated transfer printing device. The transfer printing device includes: an application mechanism of forming a flatly-applied coating film; a mechanism of fixing the substrate and aligning the electrode position of the substrate; and a mechanism of three-dimensionally driving a stamper, extracting the coating film, and transferring and stamping the extracted coating film. The transfer printing tends to have a variation in application amount compared to the screen printing, and needs a careful caution in a continuous operation, such as a cleaning management of a stamper. Accordingly, the screen printing has been in the mainstream printing.

The above described dispensing and ejecting is used to eject a fixed amount of the electroconductive bonding material to the electrode on the substrate or the terminal of the electronic components, and employs a dispenser device. The dispenser is a device which extrudes a fixed amount of the electroconductive bonding material from a needle on the tip of the syringe, by applying a pressure requested for ejection to the electroconductive bonding material accommodated in the syringe on demand, and which ejects and applies a requested amount of the electroconductive bonding material onto the electrode, by three-dimensionally driving the syringe itself and determining the electrode position on the substrate. The above dispensing has a disadvantage that the paste itself is resistant to be spread thiner compared to the screen printing, due to a technique of ejection from the needle. However, the method causes little loss of the paste in the process, may vary the position and the amount of the ejection by a program, and accordingly may apply the electroconductive bonding material onto the substrate and electronic components which have such a step and unevenness that the printing mask plate resists being pressure-welded.

The above described ink jet printing is used to eject the electroconductive bonding material from a fine nozzle, and applying the electroconductive bonding material onto the electrode on the substrate or the terminal of the electronic components.

<Primary Heat Treatment Step>

The above described primary heat treatment step is a step of subjecting the supplied electroconductive bonding material to heat treatment at a temperature lower than the melting point of a middle-melting-point metal particle, and depositing the heat-treated electroconductive bonding material onto any one of the above described electrode of the substrate or the terminal of the electronic components.

The above described primary heat treatment step is preferably conducted at the temperature lower than the melting point of the middle-melting-point metal particle for 5 seconds, and specifically is conducted preferably at 70° C. to 100° C. for 3 seconds to 7 seconds.

The above described primary heat treatment is not intended to be limiting, may be appropriately selected according to the purpose, and may be conducted, for instance, with a nitrogen reflowing device or the like.

The above described primary heat treatment may be conducted in the air, but more preferably is conducted in a nitrogen atmosphere.

<Secondary Heat Treatment Step>

The above described secondary heat treatment step is a step of heating the deposited electroconductive bonding material, and bonding the electrode of the substrate to the terminal of the electronic components.

The above described secondary heat treatment step is the step of applying a fixed temperature to the electroconductive bonding material which has been supplied to and deposited on the electrode of the substrate or the terminal of the electronic components, in such a state that the electronic components or the substrate is arranged in a furnace, and generally employs a reflowing device, a high temperature tank or the like which has a furnace adaptable to solder heat treatment.

An infrared application type, a hot-air application type and the like are in a mainstream as the heating method in the reflowing heat treatment with the use of the above described reflowing device. There are cases in which air is used and nitrogen is used for the atmosphere in the furnace in the reflowing heat treatment, but the reflowing furnace in the nitrogen atmosphere is widely used in recent high-density and high-accuracy packaging, in order to avoid the degradation of the electronic components and the solder-bonded portion due to oxidation.

The above described secondary heat treatment is preferably conducted at a temperature of the melting point of the middle-melting-point metal particle or higher and 150° C. or lower for 30 minutes or longer, and preferably is conducted at 85° C. to 150° C. for 30 minutes to 120 minutes.

The above described secondary heat treatment may be conducted in the air, but more preferably is conducted in the nitrogen atmosphere.

Here, FIG. 7 is a schematic view illustrating one example of a method for bonding a conductor according to the present invention.

Firstly, an electroconductive bonding material 20 according to the present invention is printed on a substrate 6 provided with a Cu electrode 7 with a screen printing. The initial melting point of the electroconductive bonding material 20 according to the present invention is 79° C.

Subsequently, the printed electroconductive bonding material 20 is subjected to the primary heat treatment (79° C. to 139° C.), and the heated electroconductive bonding material 20 is deposited (precoated) on the electrode 7 of the substrate. Even after the primary heat treatment, a low-melting-point component having the melting point of 139° C. or lower remains in the electroconductive bonding material 20, Subsequently, an Si chip 8 provided with an Au bump 9 is arranged on the substrate 6 having the electroconductive bonding material 20 deposited thereon, and the assembly is subjected to the secondary heat treatment (150° C.). Thereby, the Si chip 8 provided with the Au bump 9 is mounted on the substrate 6. Due to this secondary heat treatment, a metallic bonding state changes and the melting point becomes 250° C. or higher.

Figure 8:
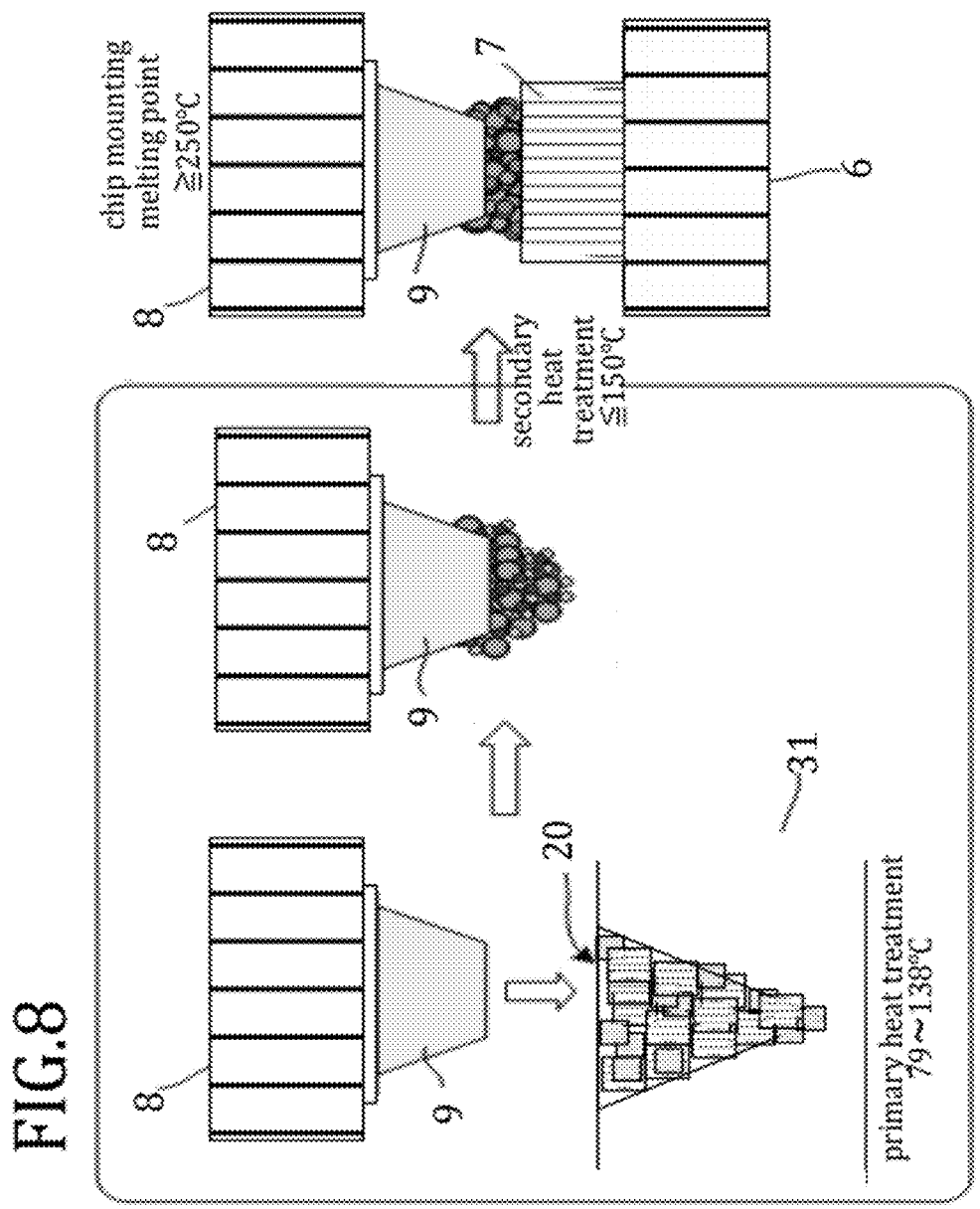
FIG. 8 is a schematic view illustrating another example of a method for bonding the conductor according to the present invention.

In addition, FIG. 8 is a schematic view illustrating another example of the method for bonding the conductor according to the present invention.

Firstly, the electroconductive bonding material 20 according to the present invention is charged into the recessed part of a countersunk jig 31 with a squeegee, and the Si chip 8 provided with the Au bump 9 is pressed to the electroconductive bonding material. Then, the assembly is subjected to the primary heat treatment (79° C. to 139° C.) together with the Si chip 8, and the electroconductive bonding material 20 is deposited (precoated) onto the Au bump 9 of the Si chip 8. Even after the primary heat treatment, a low-melting-point component having the melting point of 139° C. or lower remains in the electroconductive bonding material 20.

Subsequently, the Si chip 8 provided with the Au bump 9 having the electroconductive bonding material 20 deposited thereon is arranged on the substrate 6 having the Cu electrode 7 provided thereon, the assembly is subjected to the secondary heat treatment (150° C.), and the Si chip 8 provided with the Au bump 9 is mounted face-down on the substrate 6. Due to this secondary heat treatment, a metallic bonding state changes and the melting point becomes 250° C. or higher.

(Method for Manufacturing Semiconductor Device)

A method for manufacturing the semiconductor device according to the present invention includes at least the above described step of bonding the conductor according to the present invention, and further includes another step, as needed.

The above described step of bonding the conductor may be conducted in a similar way to the method of bonding the conductor according to the present invention.

The above described another step is not intended to be limiting, may be appropriately selected according to the purpose, and includes, for instance, a step of patterning a metal wiring and a step of forming an insulation film.

The method for manufacturing the semiconductor device according to the present invention may efficiently manufacture, for instance, various semiconductor devices which include a flash memory, a DRAM and an FRAM.

Example

The present invention will be more specifically described below with reference to examples, but the present invention is not limited to these examples.

For information, in the examples, the melting point of a metal particle, the average particle size of the metal particles, and the average thicknesses of a low-melting-point metal layer and a middle-melting-point metal layer were measured in the following way.

<Measurement of Melting Point of Metal Particle>

The melting point of the metal particle was measured with differential scanning calorimetry (DSC) (DSC6200 made by Seiko Instruments Inc.) on conditions of a temperature gradient of 0.5° C./second and a measurement temperature range of 25° C. to 250° C.

<Measurement of Average Particle Size of Metal Particles>

The average particle size of the metal particles was calculated by dispersing the metal particles in a gas phase, irradiating the dispersed metal particles with a red semiconductor-laser beam, comparing the pattern of diffracted and scattered lights by the particles, which was input in a light-receiving element, with a standard pattern, analyzing the result, and summing the particle size and the count number, with the use of a particle size distribution meter (SALD-3100, a laser diffraction particle size distribution measurement instrument made by SHIMADZU CORPORATION).

<Measurement of Average Thicknesses of Low-Melting-Point Metal Layer and Middle-Melting-Point Metal Layer>

The average thicknesses of the low-melting-point metal layer and the middle-melting-point metal layer were expressed by the average values obtained by measuring the thicknesses of the low-melting-point metal layer and the middle-melting-point metal layer 10 times with a cross-section polishing method (GRINOER-POLISHER (Beta) made by Buehler Incorporated).

Example 1

Preparation of Electroconductive Bonding Material

Metal component formed of 80 mass % of high-melting-point metal particle (Sn-58Bi-plated Cu particle with melting point of 1,083° C. (Cu) and average particle size of 40 μm), 10 mass % of middle-melting-point metal particle (Sn-58Bi particle with melting point of 139° C.) and 10 mass % of low-melting-point metal particle (17Sn-58Bi-25In particles with melting point of 79° C.) . . . 90 mass %

Flux component formed of epoxy-based flux material (F-Stick FTLD5 made by FUJITSU QUALITY LABORATORY LIMITED) . . . 10 mass %

The electroconductive bonding material of Example 1 was prepared by uniformly stirring the above described metal component and the above described flux component in a non-oxidative atmosphere.

Example 2

Preparation of Electroconductive Bonding Material

The electroconductive bonding material of Example 2 was prepared in a similar way to that in Example 1, except that a metal component was used which was formed of 80 mass % of high-melting-point metal particles (Sn-58Bi-plated Cu particles with melting point of 1,083° C. (Cu) and average particle size of 40 μm), 5 mass % of middle-melting-point metal particles (Sn-58Bi particles with melting point of 139° C.) and 15 mass % of low-melting-point metal particles (17Sn-58Bi-25In particles with melting point of 79° C.), in Example 1.

Example 3

Preparation of Electroconductive Bonding Material

The electroconductive bonding material of Example 3 was prepared in a similar way to that in Example 1, except that a metal component was used which was formed of 80 mass % of high-melting-point metal particles (Sn-58Bi-plated Cu particles with melting point of 1,083° C. (Cu) and average particle size of 40 μm), 15 mass % of middle-melting-point metal particles (Sn-58Bi particles with melting point of 139° C.) and 5 mass % of low-melting-point metal particles (17Sn-58Bi-25In particles with melting point of 79° C.), in Example 1.

Example 4

Preparation of Electroconductive Bonding Material

The electroconductive bonding material of Example 4 was prepared in a similar way to that in Example 1, except that a metal component was used which was formed of 85 mass % of high-melting-point metal particles (Sn-58Bi-plated Cu particles with melting point of 1,083° C. (Cu) and average particle size of 40 μm), 7.5 mass % of middle-melting-point metal particles (Sn-58Bi particles with melting point of 139° C.) and 7.5 mass % of low-melting-point metal particles (17Sn-58Bi-25In particles with melting point of 79° C.), in Example 1.

Example 5

Preparation of Electroconductive Bonding Material

The electroconductive bonding material of Example 5 was prepared in a similar way to that in Example 1, except that a metal component was used which was formed of 90 mass % of high-melting-point metal particles (Sn-58Bi-plated Cu particles with melting point of 1,083° C. (Cu) and average particle size of 40 μm), 5 mass % of middle-melting-point metal particles (Sn-58Bi particles with melting point of 139° C.) and 5 mass % of low-melting-point metal particles (17Sn-58Bi-25In particles with melting point of 79° C.), in Example 1.

Example 6

Preparation of Electroconductive Bonding Material

The electroconductive bonding material of Example 6 was prepared in a similar way to that in Example 1, except that a metal component was used which was formed of 95 mass % of high-melting-point metal particles (Sn-58Bi-plated Cu particles with melting point of 1,083° C. (Cu) and average particle size of 40 μm), 2.5 mass % of middle-melting-point metal particles (Sn-58Bi particles with melting point of 139° C.) and 2.5 mass % of low-melting-point metal particles (17Sn-58Bi-25In particles with melting point of 79° C.), in Example 1.

Example 7

Preparation Of Electroconductive Bonding Material

The electroconductive bonding material of Example 7 was prepared in a similar way to that in Example 1, except that a metal component was used which was formed of 75 mass % of high-melting-point metal particles (Sn-58Bi-plated Cu particles with melting point of 1,083° C. (Cu) and average particle size of 40 μm), 12.5 mass % of middle-melting-point metal particles (Sn-58Bi particles with melting point of 139° C.) and 12.5 mass % of low-melting-point metal particles (17Sn-58Bi-25In particles with melting point of 79° C.), in Example 1.

Example 8

Preparation of Electroconductive Bonding Material

The electroconductive bonding material of Example 8 was prepared in a similar way to that in Example 4, except that the high-melting-point metal particles (Sn-58Bi-plated Cu particles) in Example 4 were replaced with high-melting-point metal particles (Ag-plated Cu particles with melting point of 1,083° C. (Cu) and average particle size of 40 μm).

Example 9

Preparation of Electroconductive Bonding Material

The electroconductive bonding material of Example 9 was prepared in a similar way to that in Example 4, except that the high-melting-point metal particles (Sn-58Bi-plated Cu particles) in Example 4 were replaced with high-melting-point metal particles (Au-plated Cu particles with melting point of 1,083° C. (Cu) and average particle size of 40 μm).

Example 10

Preparation of Electroconductive Bonding Material

The electroconductive bonding material of Example 10 was prepared in a similar way to that in Example 4, except that the middle-melting-point metal particles (Sn-58Bi particles with melting point of 139° C.) in Example 4 were replaced with middle-melting-point metal particles (Sn-57Bi-1Ag with melting point of 139° C.).

Example 11

Preparation of Electroconductive Bonding Material

The electroconductive bonding material of Example 11 was prepared in a similar way to that in Example 4, except that the low-melting-point metal particles (17Sn-58Bi-25In particles with melting point of 79° C.) in Example 4 were replaced with low-melting-point metal particles (12Sn-41Bi-47In with melting point of 59° C.).

Example 12

Preparation of Electroconductive Bonding Material

The electroconductive bonding material of Example 12 was prepared in a similar way to that in Example 4, except that the epoxy-based flux material in Example 4 was replaced with a rosin-based flux material (F-Stick FTLD4 made by FUJITSU QUALITY LABORATORY LIMITED).

Example 13

Preparation of Electroconductive Bonding Material

-Preparation of Multilayer Metal Particle-
A middle-melting-point metal layer formed of a middle-melting-point metal particle (Sn-58Bi particle with melting point of 139° C.) was formed on each surface of high-melting-point metal particles (Cu particles with melting point of 1,083° C. and average particle size of 40 μm) with an electroless plating method so as to have the average thickness of 1 μm.

Subsequently, a low-melting-point metal layer formed of a low-melting-point metal particle (17Sn-58Bi-25In particle with melting point of 79° C.) was formed on the middle-melting-point metal layer with an electroless plating method so as to have the average thickness of 1 μm. By the above steps, the multilayer metal particle of a metal component was prepared.

-Preparation of Electroconductive Bonding Material-
Prepared multilayer metal particles . . . 90 mass %
Epoxy-based flux material (F-Stick FTLD5 made by FUJITSU QUALITY LABORATORY LIMITED) . . . 10 mass %

The electroconductive bonding material of Example 13 was prepared by uniformly stirring the above described metal component and the above described flux component in a non-oxidizing atmosphere.

Example 14

Preparation of Electroconductive Bonding Material

The electroconductive bonding material of Example 14 was prepared in a similar way to that in Example 13, except that the high-melting-point metal particles (Cu particles with melting point of 1,083° C. and average particle size of 40 μm) in Example 13 were replaced with high-melting-point metal particles (Cu particles with melting point of 1,083° C. and average particle size of 35 μm).

Example 15

Preparation of Electroconductive Bonding Material

The electroconductive bonding material of Example 15 was prepared in a similar way to that in Example 13, except that the high-melting-point metal particles (Cu particles with melting point of 1,083° C. and average particle size of 40 μm) in Example 13 were replaced with high-melting-point metal particles (Cu particles with melting point of 1,083° C. and average particle size of 45 μm).

Example 16

Preparation of Electroconductive Bonding Material

The electroconductive bonding material of Example 16 was prepared in a similar way to that in Example 13, except that the average thicknesses of the middle-melting-point metal layer and the low-melting-point metal layer were set at 0.5 μm, in Example 13.

Example 17

Preparation of Electroconductive Bonding Material

The electroconductive bonding material of Example 17 was prepared in a similar way to that in Example 13, except that a low-melting-point metal layer formed of a low-melting-point metal particle (17Sn-58Bi-25In particle with melting point of 79° C.) was formed on each of high-melting-point metal particles (Cu particles with melting point of 1,083° C. and average particle size of 40 μm) with an electroless plating method so as to have the average thickness of 1 μm, and subsequently a middle-melting-point metal layer formed of a middle-melting-point metal particle (Sn-58Bi particle with melting point of 139° C.) was formed on the low-melting-point metal layer with an electroless plating method so as to have the average thickness of 1 μm, in Example 13.

Comparative Example 1

Preparation of Electroconductive Bonding Material

The electroconductive bonding material of Comparative Example 1 was prepared in a similar way to that in Example 1, except that the low-melting-point metal particle (17Sn-58Bi-25In particles with melting point of 79° C.) was not added to the metal component, in Example 1.

Comparative Example 2

Preparation of Electroconductive Bonding Material

The electroconductive bonding material of Comparative Example 2 was prepared in a similar way to that in Example 1, except that the middle-melting-point metal particle (Sn-58Bi particles with melting point of 139° C.) was not added to the metal component, in Example 1.

Comparative Example 3

Preparation of Electroconductive Bonding Material

The electroconductive bonding material of Comparative Example 3 was prepared in a similar way to that in Example 1, except that high-melting-point metal particles (Sn-58Bi-plated Cu particles with melting point of 1,083° C. (Cu) and average particle size of 40 μm) were not added to the metal component, in Example 1.

Next, various characteristics were evaluated by using each of the prepared electroconductive bonding materials, in the following way. The result is shown in Table 1.
<Evaluation for Performance of Electroconductive Bonding Material when Having been Supplied>

A pattern was printed (supplied) on a substrate with a screen printing by using each of the electroconductive bonding materials, and the release properties of the screen printing plate were determined according to the following criteria, as the evaluation for the performance of the electroconductive bonding material when having been supplied.

[Evaluation Criteria]

Good: adequate releasability of printing plate and adequate

Fair: poor releasability of printing plate but in practically usable level

Poor: poor releasability of printing plate and poor

<Evaluation for Performance of Electronic Components when Having been Packaged>

The wettability of solder was visually inspected by using each of the electroconductive bonding materials, as the evaluation for the performance of the material when the electronic components was packaged, and was evaluated according to the following criteria.

[Evaluation Criteria]

Good: adequate wettability of solder

Fair: slightly inferior wettability of solder (in practically usable level)

Poor: poor wettability of solder

<Evaluation for Performance of Semiconductor Device>

A TEG (Test Equipment Group) provided with a daisy chain was prepared by using each of the electroconductive bonding materials, and the conduction state of the semiconductor device was inspected with a conduction tester, and was evaluated according to the following criteria, as the evaluation for the performance of the semiconductor device.

[Evaluation Criteria]

Good: adequate conduction

Fair: slightly inferior conduction (in practically usable level)

Poor: poor conduction

TABLE 1-1

|  |  |  | Example | | | | | | |
|---|---|---|---|---|---|---|---|---|---|
|  |  |  | 1 | 2 | 3 | 4 | 5 | 6 | 7 |
| High-melting-point metal particle | Sn—58Bi-plated Cu particle | | 80 | 80 | 80 | 85 | 90 | 95 | 75 |
|  | Ag-plated Cu particle | | — | — | — | — | — | — | — |
| Middle-melting-point metal particle | Sn—58Bi particle (139° C.) | | 10 | 5 | 15 | 7.5 | 5 | 2.5 | 12.5 |
| Low-melting-point metal particle | 17Sn—58Bi—25In particle (79° C.) | | 10 | 15 | 5 | 7.5 | 5 | 2.5 | 12.5 |
| Subtotal of metal component (mass %) | | | 90 | 90 | 90 | 90 | 90 | 90 | 90 |
| Epoxy-based flux material | | | 10 | 10 | 10 | 10 | 10 | 10 | 10 |
| Rosin-based flux material | | | — | — | — | — | — | — | — |
| Evaluation | Evaluation for performance of electroconductive bonding material when having been supplied | | Good | Good | Good | Good | Good | Good | Good |
|  | Evaluation for performance of electronic components when having been packaged | | Good | Good | Good | Good | Good | Fair | Good |
|  | Performance of semiconductor device | | Good | Good | Good | Good | Good | Fair | Fair |

|  |  | Example | | | | |
|---|---|---|---|---|---|---|
|  |  | 8 | 9 | 10 | 11 | 12 |
| High-melting-point metal particle | Sn—58Bi-plated Cu particle | — | — | 85 | 85 | 85 |
|  | Ag-plated Cu particle | 85 | — | — | — | — |
|  | Au-plated Cu particle | — | 85 | — | — | — |
| Middle-melting-point metal particle | Sn—58Bi particle (139° C.) | 7.5 | 7.5 | — | 7.5 | 7.5 |
|  | Sn—57Bi—1Ag particle (139° C.) | — | — | 7.5 | — | — |
| Low-melting-point metal particle | 17Sn—58Bi—25In particle (79° C.) | 7.5 | 7.5 | 7.5 | — | 7.5 |
|  | 12Sn—41Bi—47In particle (59° C.) | — | — | — | 7.5 | — |
| Subtotal of metal component (mass %) | | 90 | 90 | 90 | 90 | 90 |
| Epoxy-based flux material | | 10 | 10 | 10 | 10 | — |
| Rosin-based flux material | | — | — | — | — | 10 |
| Evaluation | Evaluation for performance of electroconductive bonding material when having been supplied | Good | Good | Good | Good | Good |
|  | Evaluation for performance of electronic components when having been packaged | Good | Good | Good | Good | Good |
|  | Performance of semiconductor device | Good | Good | Good | Good | Good |

|  |  |  | Example | | | | |
|---|---|---|---|---|---|---|---|
|  |  |  | 13 | 14 | 15 | 16 | 17 |
| Multilayer metal particle | High-melting-point metal particle (Cu particle) | Average particle size (μm) | 40 | 35 | 45 | 40 | 40 |
|  | Middle-melting-point metal layer (Sn—58Si) | Average thickness (μm) | 1 | 1 | 1 | 0.5 | 1 |
|  | Low-melting-point metal layer (17Sn—58Bi—25In) | Average thickness (μm) | 1 | 1 | 1 | 0.5 | 1 |
| Subtotal of metal component (mass %) | | | 90 | 90 | 90 | 90 | 90 |
| Epoxy-based flux material | | | 10 | 10 | 10 | 10 | 10 |

TABLE 1-1-continued

| Evaluation | Evaluation for performance of electroconductive bonding material when having been supplied | Good | Good | Fair | Good | Good |
|---|---|---|---|---|---|---|
| | Evaluation for performance of electronic components when having been packaged | Good | Good | Fair | Fair | Good |
| | Performance of semiconductor device | Good | Good | Fair | Fair | Good |

| | | Comparative Example | | |
|---|---|---|---|---|
| | | 1 | 2 | 3 |
| High-melting-point metal particle | Sn—58Bi-plated Cu particle | 85 | 85 | — |
| Middle-melting-point metal particle | Sn—58Bi particle (139° C.) | — | 15 | 50 |
| Low-melting-point metal particle | 17Sn—58Bi—25In particle (79° C.) | 15 | — | 50 |
| | Subtotal of metal component (mass %) | 90 | 90 | 90 |
| | Epoxy-based flux material | 10 | 10 | 10 |
| Evaluation | Evaluation for performance of electroconductive bonding material when having been supplied | Good | Good | Good |
| | Evaluation for performance of electronic components when having been packaged | Poor | Poor | Good |
| | Performance of semiconductor device | Poor | Poor | Poor |

Example 18

The method for manufacturing the semiconductor device of Example 18 will be described below with reference to FIG. 9.

(1) The electroconductive bonding material 20 of Example 1 was printed (supplied) on a substrate (substratum substrate) 6 having a Cu electrode 7 with a diameter of 30 μm provided thereon, with a screen printing.
(2) The printed electroconductive bonding material 20 was heated (primary heat treatment) at 100° C. for 5 minutes, and the heated electroconductive bonding material 20 was deposited (precoated) on the electrode 7 of the substrate.
(3) An Si chip 8 provided with an Au bump 9 was arranged on the substrate having the electroconductive bonding material 20 deposited thereon, and the assembly was heated (secondary heat treatment) at 150° C. for 30 minutes. Thereby, the Si chip 8 provided with the Au bump 9 was mounted face-down on the substrate 6.
(4) An underfill material (epoxy-based thermosetting material) 32 was charged between the substrate 6 and the Si chip 8.
(5) The underfill material 32 was subjected to a curing process (which serves as curing for the change of the melting point of the electroconductive bonding material 20) at 150° C. for 1 hour and 30 minutes, and the Si chip 8 was packaged. At this time, the melting point of the electroconductive bonding material 20 is 250° C. or higher.

Figure 9:
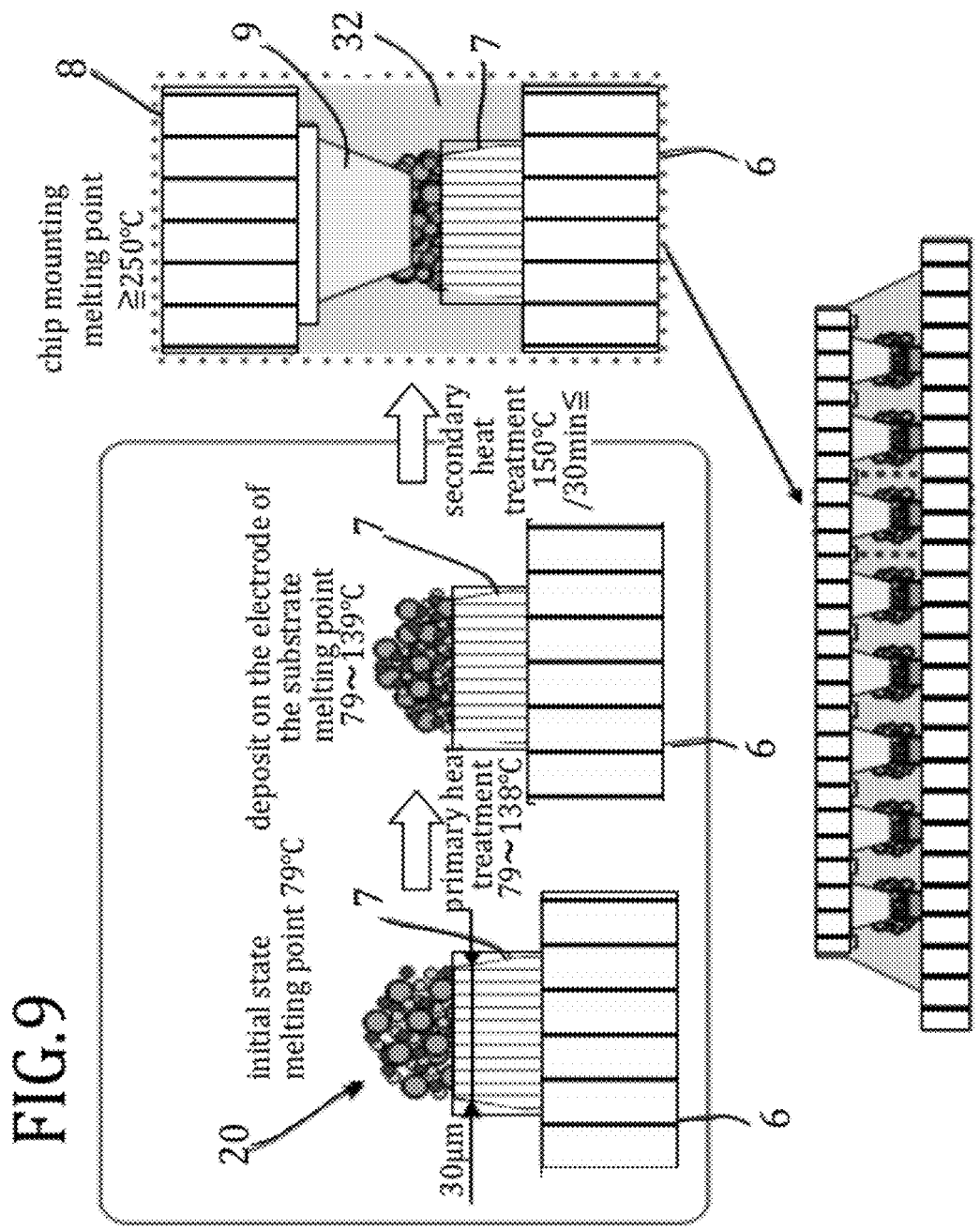
FIG. 9 is a schematic view illustrating a method for manufacturing the semiconductor devices of Examples 18 and 19.

By the above steps, the semiconductor device illustrated in FIG. 9 was manufactured in which flip chips were packaged.

Example 19

The method for manufacturing the semiconductor device of Example 19 will be described below with reference to FIG. 9.

(1) The electroconductive bonding material 20 of Example 13 was printed (supplied) on a substrate (substratum substrate) 6 having an Au-plated electrode 7 with a diameter of 25 μm provided thereon, with a screen printing.
(2) The printed electroconductive bonding material 20 was heated (primary heat treatment) at 100° C. for 5 seconds, and the heated electroconductive bonding material 20 was deposited (precoated) on the electrode 7 of the substrate.
(3) An Si chip 8 provided with an Au bump 9 was arranged on the substrate having the electroconductive bonding material 20 deposited thereon, and the assembly was heated (secondary heat treatment) at 150° C. for 30 minutes. Thereby, the Si chip 8 provided with the Au bump 9 was mounted face-down on the substrate 6.
(4) An underfill material (epoxy-based thermosetting material) 32 was charged between the substrate 6 and the Si chip 8.
(5) The underfill material 32 was subjected to a curing process (which serves as curing for the change of the melting point of the electroconductive bonding material 20) at 150° C. for 1 hour and 30 minutes, and the Si chip 8 was packaged. At this time, the melting point of the electroconductive bonding material 20 is 250° C. or higher.

By the above steps, the semiconductor device illustrated in FIG. 9 was manufactured in which flip chips were packaged.

Example 20

The method for manufacturing the semiconductor device of Example 20 will be described below with reference to FIG. 10.

(1) The electroconductive bonding material 20 of Example 1 was charged into the recessed part of a countersunk jig (silicon substrate) 31 with a squeegee (metal squeegee), an Si chip 8 provided with an Au bump 9 with a diameter of 25 μm was pressed to the material, and the assembly was heated (primary heat treatment) at 100° C. for 5 seconds. Thereby, the electroconductive bonding material 20 was deposited (precoated) on the Au bump 9 of the Si chip 8.
(2) The Si chip 8 provided with the Au bump having the electroconductive bonding material 20 deposited thereon was arranged on a substrate 6 having a Cu electrode 7 with a diameter of 30 μm provided thereon, and the assembly was heated (secondary heat treatment) at 150° C. for 30 minutes. Thereby, the Si chip 8 provided with the Au bump 9 was mounted face-down on the substrate (substratum substrate) 6.
(3) An underfill material (epoxy-based thermosetting material) 32 was charged between the substrate 6 and the Si chip 8.
(4) The underfill material 32 was subjected to a curing process (which serves as curing for the change of the melting point of the electroconductive bonding material 20) at 150° C. for 1 hour and 30 minutes, and the Si chip 8 was packaged. At this time, the melting point of the electroconductive bonding material is 250° C. or higher.

Figure 10:
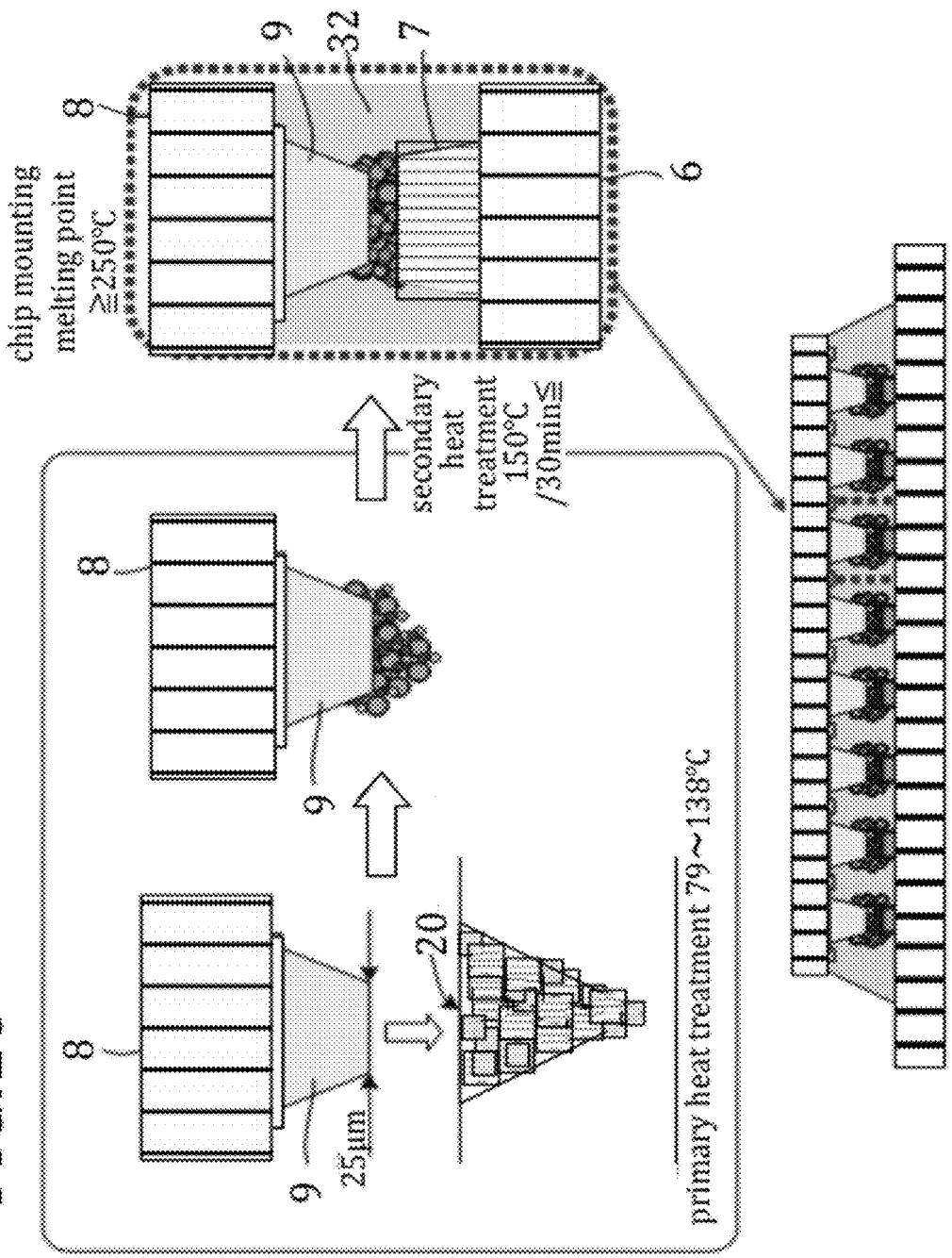
FIG. 10 is a schematic view illustrating a method for manufacturing the semiconductor device of Example 20.

Through the above steps, the semiconductor device illustrated in FIG. 10 was manufactured, in which flip chips were packaged.

Example 21

The method for manufacturing the semiconductor device of Example 21 will be described below with reference to FIG. 11.

(1) The electroconductive bonding material 30 of Example 13 was printed (supplied) on a substrate (substratum substrate) 6 having a pair of Cu electrodes 33 provided thereon, with a screen printing.

(2) The printed electroconductive bonding material 30 was heated (primary heat treatment) at 100° C. for 5 seconds, and the heated electroconductive bonding material 30 was deposited (precoated) on the electrode 33 of the substrate.

(3) A square 0630 SMD chip 8 with a size of 0.6 mm×0.3 mm was arranged between the pair of the Cu electrodes 33 and the assembly was heated (secondary heat treatment) at 150° C. for 30 minutes. Thereby, the SMD chip 8 was mounted on the substrate 6. At this time, the melting point of the electroconductive bonding material is 250° C. or higher.

Figure 11:
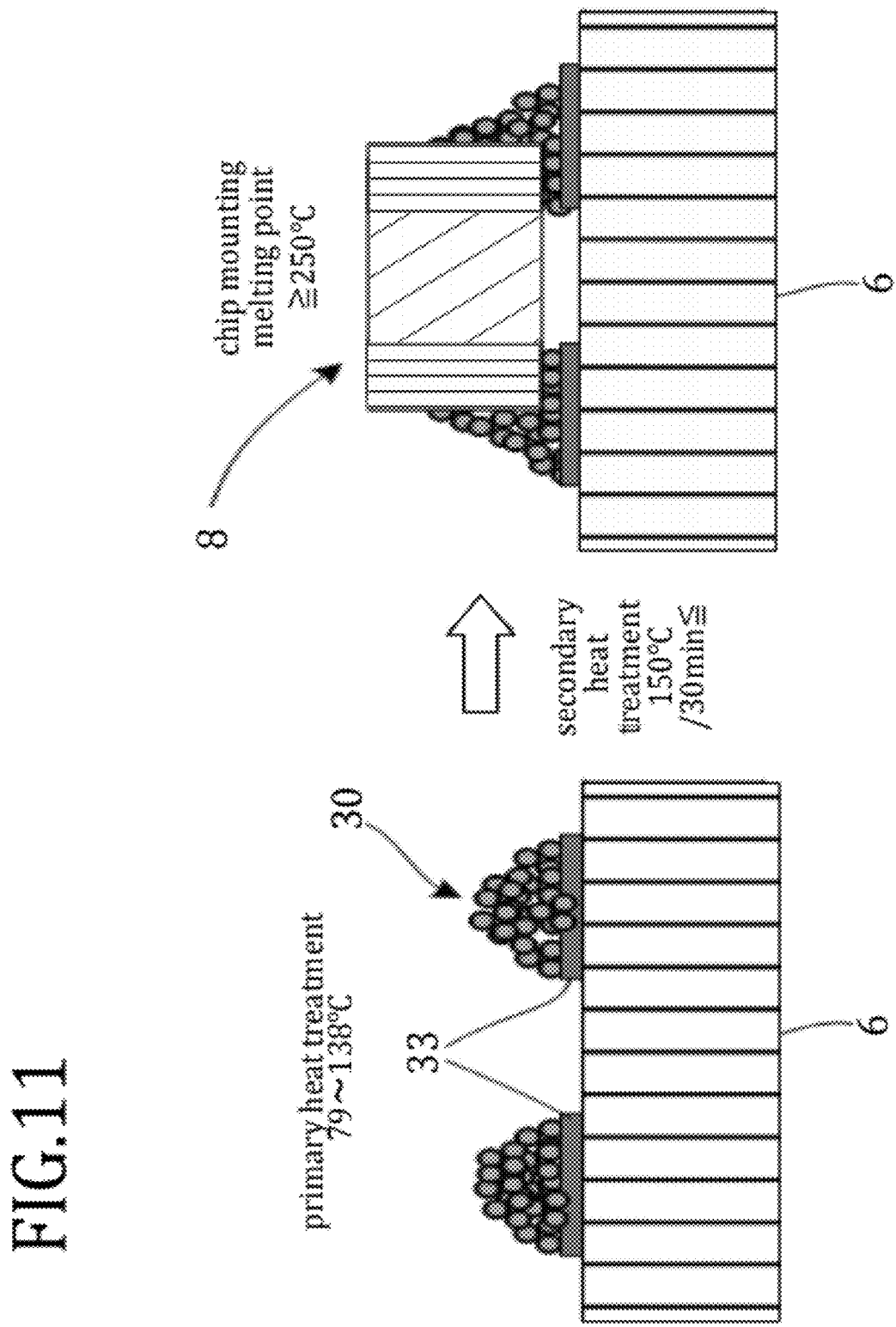
FIG. 11 is a schematic view illustrating a method for manufacturing the semiconductor device of Example 21.

By the above steps, the semiconductor device illustrated in FIG. 11 was manufactured in which the SMD chip was packaged.

Relating to the above described embodiments including Examples 1 to 21, the following additional claims will be further disclosed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An electro-conductive bonding material comprising:
   metal components of a high-melting-point metal particle that has a first melting point of 150° C. or higher;
   a middle-melting-point metal particle that has a second melting point which is between 80° C. and 139° C.; and
   a low-melting-point metal particle that has a third melting point of 79° C. or lower.

2. The electro-conductive bonding material according to claim 1,
   wherein the content of the high-melting-point metal particle in the metal component is 80 mass % to 90 mass %, the content of the middle-melting-point metal particle in the metal component is 5 mass % to 15 mass %, and the content of the low-melting-point metal particle in the metal component is 5 mass % to 15 mass %.

3. The electro-conductive bonding material according to claim 1, wherein the high-melting-point metal particle is at least one particle selected from the group consisting of an Au particle, an Ag particle, a Cu particle, an Au-plated Cu particle, an Sn—Bi-plated Cu particle and an Ag-plated Cu particle.

4. The electro-conductive bonding material according to claim 1, wherein the high-melting-point metal particle is any one of the Au-plated Cu particle, the Sn—Bi-plated Cu particle and the Ag-plated Cu particle.

5. The electro-conductive bonding material according to claim 1, wherein the low-melting-point metal particle is an Sn—Bi—In particle and the middle-melting-point metal particle is an Sn—Bi particle.

6. The electro-conductive bonding material according claim 1, wherein the metal component is a multilayer metal particle which has a middle-melting-point metal layer formed of the middle-melting-point metal particle and a low-melting-point metal layer formed of the low-melting-point metal particle formed on the surface of the high-melting-point metal particle, in this order.

7. The electro-conductive bonding material according to claim 6, wherein the average particle size of the high-melting-point metal particles is 40 μm or less, the average thickness of the middle-melting-point metal layer is 1 μm or more, and the average thickness of the low-melting-point metal layer is 1 μm or more.

8. The electro-conductive bonding material according to claim 1, wherein the content of the metal component is 50 mass % to 95 mass % with respect to the electroconductive bonding material.

9. The electro-conductive bonding material according to claim 1, further comprising a flux component which comprises at least any one of an epoxy-based flux material and a rosin-based flux material.

10. The electro-conductive bonding material according to claim 9, wherein the content of the flux component is 5 mass % to 50 mass % with respect to the electroconductive bonding material.

* * * * *